(12) United States Patent
Hara et al.

(10) Patent No.: US 6,714,277 B2
(45) Date of Patent: Mar. 30, 2004

(54) EXPOSURE APPARATUS, GAS REPLACEMENT METHOD, SEMICONDUCTOR DEVICE MANUFACTURING METHOD, SEMICONDUCTOR MANUFACTURING FACTORY AND EXPOSURE APPARATUS MAINTENANCE METHOD

(75) Inventors: Shinichi Hara, Saitama (JP); Yutaka Tanaka, Tochigi (JP); Kazuyuki Kasumi, Tochigi (JP); Toru Hirabayashi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/818,625

(22) Filed: Mar. 28, 2001

(65) Prior Publication Data
US 2001/0035942 A1 Nov. 1, 2001

(30) Foreign Application Priority Data

Mar. 30, 2000 (JP) .................................. 2000-093686
Mar. 23, 2001 (JP) .................................. 2001-085531

(51) Int. Cl.⁷ .............................................. G03B 27/52
(52) U.S. Cl. .................................... 355/30; 355/73

(58) Field of Search ................................. 355/30, 53, 73, 355/76

(56) References Cited

U.S. PATENT DOCUMENTS

| 4,964,940 A | * | 10/1990 | Auvert et al. ............... 118/50.1 |
| 5,093,579 A | | 3/1992 | Amemiya et al. ........ 250/453.1 |
| 5,172,403 A | | 12/1992 | Tanaka et al. ................ 378/34 |
| 5,191,218 A | | 3/1993 | Mori et al. ............ 250/453.11 |
| 6,252,648 B1 | * | 6/2001 | Hase et al. ............ 219/121.84 |
| 6,295,121 B1 | * | 9/2001 | Nakamura .................... 355/30 |
| 6,333,775 B1 | * | 12/2001 | Haney et al. ................ 277/608 |
| 6,341,006 B1 | * | 1/2002 | Murayama et al. ....... 250/492.1 |
| 6,385,497 B1 | * | 5/2002 | Ogushi et al. .............. 700/109 |

* cited by examiner

Primary Examiner—Russell Adams
Assistant Examiner—D. Ben Esplin
(74) Attorney, Agent, or Firm—Fitzpatrick, Cella, Harper & Scinto

(57) ABSTRACT

An exposure apparatus includes a chamber which incorporates an optical element and surrounds a predetermined region, a mechanism for setting an inert gas atmosphere in the chamber, and a closed vessel which surrounds the chamber. The purity of inert gas in the chamber is higher than a purity of inert gas in the closed vessel.

52 Claims, 14 Drawing Sheets

FIG. 11

| | |
|---|---|
| URL | http://www.maintain.co.jp/db/input.html |

TROUBLE DB INPUT WINDOW

OCCURRENCE DATE [2000/3/15] ~404
TYPE OF APPARATUS [*********] ~401
SUBJECT [OPERATING ERROR (START-UP ERROR)] ~403
SERIAL NUMBER S/N [465NS4580001] ~402
DEGREE OF URGENCY [D] ~405
SYMPTOM [LED IS KEPT FLICKERING AFTER POWER-ON] ~406
REMEDY [POWER ON AGAIN (PRESS RED BUTTON IN ACTIVATION)] ~407
PROGRESS [INTERIM HAS BEEN DONE] ~408

(SEND) (RESET)    410             411                  412
LINK TO RESULT LIST DATABASE   SOFTWARE LIBRARY   OPERATING GUIDE

EXPOSURE APPARATUS, GAS REPLACEMENT METHOD, SEMICONDUCTOR DEVICE MANUFACTURING METHOD, SEMICONDUCTOR MANUFACTURING FACTORY AND EXPOSURE APPARATUS MAINTENANCE METHOD

FIELD OF THE INVENTION

The present invention relates to a gas replacement method and, more particularly, to a method of replacing atmospheric gas in the optical path of vacuum ultraviolet light from outer air to inert gas in a semiconductor exposure apparatus using vacuum ultraviolet light as a light source, and an exposure apparatus for performing this gas replacement.

BACKGROUND OF THE INVENTION

Along with the trend toward increasing the integration degree and micropatterning semiconductor devices, demands have arisen for higher resolution in exposure apparatuses such as a stepper. The resolution is proportional to the wavelength of exposure light. The exposure wavelength is becoming shorter, and a g-line (wavelength: 436 nm) in the visible region changes to an i-line (wavelength: 365 nm) in the ultraviolet region. Recently, a KrF excimer laser beam (wavelength: 248 nm) is used, and the use of an ArF excimer laser beam (wavelength: 193 nm), an $F_2$ laser beam (wavelength: 157 nm), and an $Ar_2$ laser beam (wavelength: 126 nm) has been examined.

In a wavelength region of the ArF excimer laser beam or shorter, absorption by oxygen in air occurs, and the transmittance decreases. To prevent this, an exposure apparatus using an ArF excimer laser beam replaces most of gas in the optical path of exposure light by nitrogen. Even nitrogen causes slight absorption in a wavelength region of 190 nm or less (vacuum ultraviolet light), so nitrogen must be replaced by another gas (inert gas other than nitrogen) which transmits light. The atmosphere around the optical path of exposure light and an optical element is most desirably replaced by helium in consideration of high safety, high thermal conductivity, and small changes in refractive index by the temperature in such gas.

In general, to replace outer air in the optical path of exposure light by another gas, the optical path is incorporated in a closed vessel, replacement gas is supplied from a supply port by using one end of the closed vessel as the gas supply port and the other end as a discharge port, and a gas flow path is formed in the closed vessel so as to fill the entire optical path with the replacement gas. Gas in the closed vessel is replaced by convection and molecular diffusion.

Gas supplied to the closed vessel purges the outer air present in the vessel from the beginning. On this stage, the concentration around the discharge port hardly changes. Then, convection discharges the diluted outer air. On this stage, the concentration of the original outer air exponentially rapidly decreases. After that, the concentration gradually decreases. This is considered that gas replacement at a stagnation point at which gas hardly flows is progressed by molecular diffusion.

Only when gas replacement at a stagnation point at which gas hardly flows is progressed by molecular diffusion, does it take a very long time to decrease the concentration of gas present in the vessel from the beginning.

On the other hand, a continuous absorption band by oxygen exists in the wavelength region of vacuum ultraviolet light. Light is greatly absorbed at a high oxygen concentration in the optical path, and the oxygen concentration must be suppressed to about 1 ppm or less in the use of an exposure apparatus. If, however, air is replaced by helium by the conventional method, gas replacement at a stagnation point is mainly performed by only molecular diffusion, and it takes a long time to replace gas to a desired oxygen concentration.

SUMMARY OF THE INVENTION

The present invention has been proposed to solve the conventional problems, and has as its object to rapidly purge outer air in a vessel which airtightly contains the periphery of the optical path of exposure light for a semiconductor exposure apparatus.

An exposure apparatus of the present invention for achieving the above object comprises a chamber which incorporates an optical element and surrounds a predetermined region, a closed vessel which surrounds the chamber, and a pump for reducing an internal pressure of the chamber, wherein a pressure of the closed vessel is also reduced when the internal pressure of the chamber is reduced.

The chamber is desirably supported by the closed vessel.

The exposure apparatus desirably further comprises a displacement mechanism for generating a displacement between the chamber and the closed vessel.

The exposure apparatus desirably further comprises a measurement device for measuring a positional relationship between a reference member and the chamber. It is preferable that a positional relationship between a reference member and the chamber be measured and that a displacement mechanism be controlled based on a measurement result.

The closed vessel desirably has a transmission window for transmitting light, and the transmission window is preferably formed from fluoride glass.

The closed vessel desirably has an opening/closing door.

The exposure apparatus desirably further comprises a vent hole for allowing the chamber and the closed vessel to communicate with each other, and the vent hole is preferably freely opened/closed.

The pump desirably discharges gas from the closed vessel.

The pump desirably discharges gas from the closed vessel to discharge gas from the chamber via a vent hole formed in the chamber.

The pump desirably discharges gas from the chamber.

The chamber desirably incorporates at least some of the optical elements of an illumination optical unit.

The chamber desirably incorporates at least some of the optical elements of a projection optical unit.

Inert gas is desirably supplied after the internal pressure of the chamber is reduced. The inert gas preferably includes at least one of helium and nitrogen.

The internal pressure of the chamber is desirably reduced a plurality of number of times.

The chamber desirably has a gas supply port and a gas discharge port.

The chamber desirably surrounds at least part of an optical path of light in a vacuum ultraviolet region.

Another exposure apparatus of the present invention comprises a chamber which incorporates an optical element and surrounds a predetermined region, a mechanism for setting an inert gas atmosphere in the chamber, and a closed vessel which surrounds the chamber, wherein a purity of inert gas in the chamber is higher than a purity of inert gas in the closed vessel.

The purity of the inert gas in the closed vessel is desirably higher than a purity of inert gas outside the closed vessel.

The mechanism desirably discharges gas from the chamber before setting the inert gas atmosphere in the chamber.

The closed vessel desirably has a transmission window for transmitting light, and the transmission window is preferably formed from fluoride glass.

The closed vessel desirably has an opening/closing door. The exposure apparatus desirably further comprises a vent hole for allowing the chamber and the closed vessel to communicate with each other, and the vent hole is preferably freely opened/closed.

The chamber desirably incorporates at least some of the optical elements of an illumination optical unit.

The chamber desirably incorporates at least some of the optical elements of a projection optical unit.

The inert gas desirably contains at least one of helium and nitrogen.

The chamber desirably surrounds at least part of an optical path of light in a vacuum ultraviolet region.

Still another exposure apparatus of the present invention comprises a chamber which incorporates an optical element and surrounds a predetermined region, a mechanism for setting an inert gas atmosphere in the chamber, and a closed vessel which surrounds the chamber, wherein an internal pressure of the chamber is higher than an internal pressure of the closed vessel.

A pressure of inert gas in the closed vessel is desirably higher than a pressure of inert gas outside the closed vessel.

The mechanism desirably discharges gas from the chamber before setting the inert gas atmosphere in the chamber.

The closed vessel desirably has a transmission window for transmitting light, and the transmission window is preferably formed from fluoride glass. The closed vessel desirably has an opening/closing door.

The exposure apparatus desirably further comprises a vent hole for allowing the chamber and the closed vessel to communicate with each other, and the vent hole is preferably freely opened/closed.

The chamber desirably incorporates at least some of the optical elements of an illumination optical unit.

The chamber desirably incorporates at least some of the optical elements of a projection optical unit.

The inert gas desirably includes at least one of helium and nitrogen.

The chamber desirably surrounds at least part of an optical path of light in a vacuum ultraviolet region.

A gas replacement method of the present invention for achieving the above object comprises the steps of reducing an internal pressure of a chamber which incorporates an optical element, reducing a pressure of a closed vessel which surrounds the chamber, and supplying inert gas into the chamber.

Another gas replacement method of the present invention comprises the steps of supplying inert gas into a chamber which incorporates an optical element, supplying inert gas into a closed vessel which surrounds the chamber, and controlling a purity of the inert gas in the chamber to be higher than a purity of the inert gas in the closed vessel.

Still another gas replacement method of the present invention comprises the steps of supplying inert gas into a chamber which incorporates an optical element, supplying inert gas into a closed vessel which surrounds the chamber, and controlling a pressure of the inert gas in the chamber to be higher than a pressure of the inert gas in the closed vessel.

A semiconductor device manufacturing method using any one of the exposure apparatuses also falls within the spirit and scope of the present invention.

A semiconductor manufacturing factory including any one of the exposure apparatuses also falls within the spirit and scope of the present invention.

A maintenance method for any one of the exposure apparatuses also falls within the spirit and scope of the present invention.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 is a view showing a display window on a display device;

DETAILED DESCRIPTION OF THE PREFERRED EMBODIMENTS

Preferred embodiments of the present invention will now be described in detail in accordance with the accompanying drawings.

Embodiments of Exposure Apparatus

First Embodiment

Figure 1:
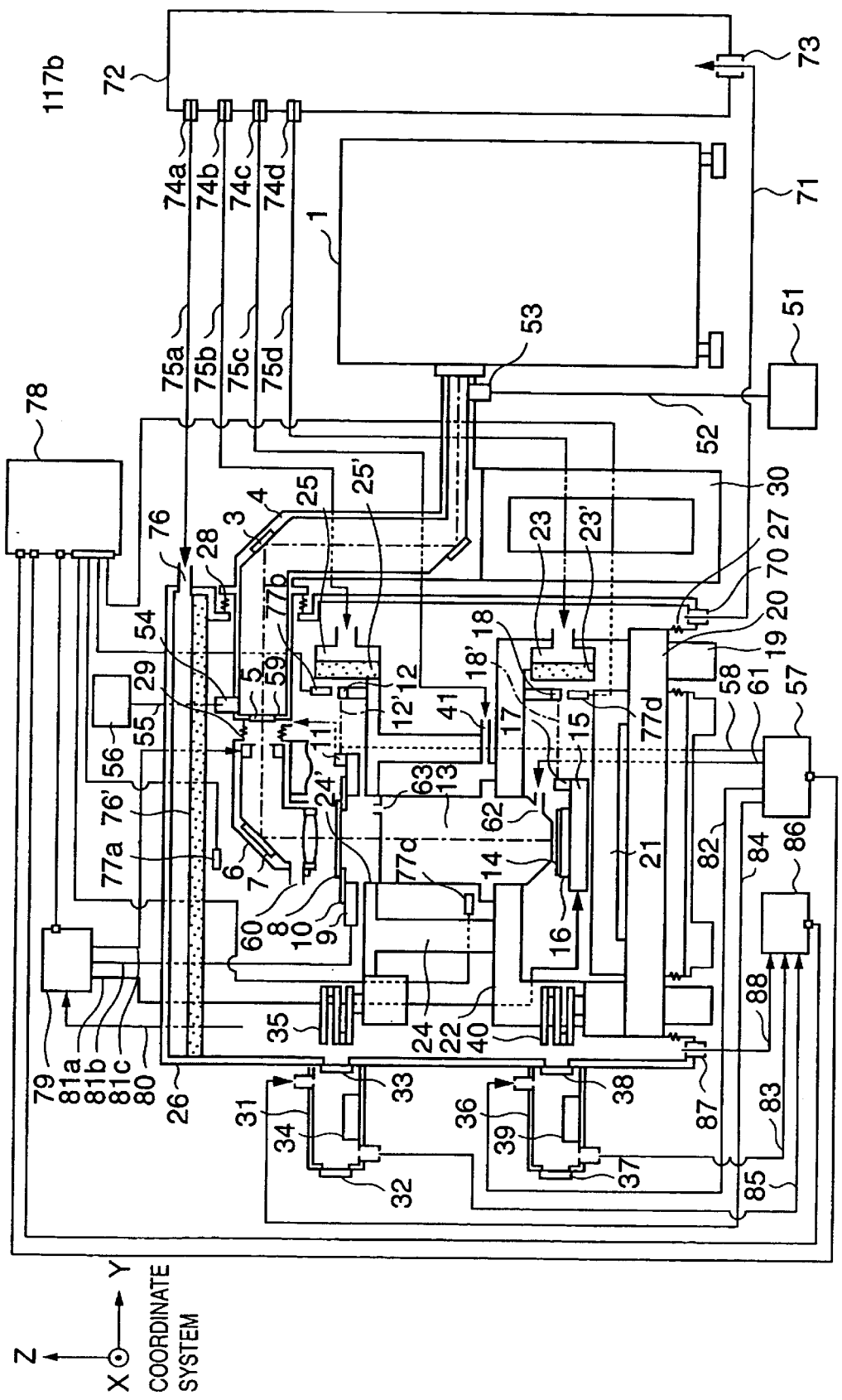
FIG. 1 is a sectional view showing the overall arrangement of an exposure apparatus.

FIG. 1 is a sectional view showing the overall arrangement of an embodiment of an exposure apparatus according to the present invention.

In FIG. 1, a laser device 1 as the light source of the exposure apparatus is installed on the floor or lower floor separately from the exposure apparatus. The laser device 1 is an excimer laser device for generating vacuum ultraviolet light in a wavelength region of 160 nm or less. The first embodiment employs an $F_2$ excimer laser having an oscillation wavelength around 157 nm, but may use a light source having a wavelength in the ultraviolet region, such as an $Ar_2$ laser having an oscillation wavelength around 126 nm.

A laser beam emitted by the laser device 1 enters the apparatus main body via mirrors 2 and 3. A chamber 4 has a closed structure in order to shield the periphery of the optical path including the mirrors 2 and 3 from ventilation with outer air. Glass 5 is disposed at the light exit portion of the chamber 4. The glass 5 transmits the laser beam from the laser device 1 that irradiates the glass 5 from the inside of the chamber 4, and introduces the laser beam into a housing 6 (to be described later). The glass 5 is held to ensure the sealed state of the chamber 4.

The glass 5 is a glass material consisting of a fluoride. More specifically, any one of fluorite ($CaF_2$), magnesium fluoride ($MgF_2$), barium fluoride ($BaF_2$), $SrF_2$, and fluorine-doped quartz may be used. These glass materials exhibit high transmittances with respect to light having a wavelength of 157 nm or less.

Details of the interior of the chamber 4 will be described later.

The light having passed through the glass 5 enters the housing 6 and illuminates a reticle 8 via a mirror 7 in the housing 6.

Details of the interior of the housing 6 will also be described later.

The reticle 8 is set on a reticle holder 10 on a reticle stage 9. The reticle stage 9 is driven by a reticle stage driving unit (not shown) in the Y direction which is an in-plane direction perpendicular to the optical axis and is a scan direction. A bar mirror 11 is fixed to the reticle stage 9. An interferometer 12 measures the position of the bar mirror and thus measures the position of the reticle stage. FIG. 1 shows only one interferometer 12 which is driven in the Y direction in FIG. 1 as a scan direction. An interferometer and bar mirror may also be arranged in the X direction in FIG. 1 so as to measure the position of the reticle stage along the X- and Y-axes.

A pattern (not shown) drawn on the reticle 8 is reduced at a predetermined magnification by a projection optical unit 13, and transferred by exposure to a wafer 14 coated with a photosensitive agent. Details of the interior of the projection optical unit 13 will also be described later.

The wafer 14 is set on a wafer chuck 16 on a wafer stage 15. The wafer stage 15 is driven by a wafer stage driving unit (not shown) in the X and Y in-plane directions perpendicular to the optical axis. A bar mirror 17 is fixed to the wafer stage. An interferometer 18 measures the position of the bar mirror and thus measures the position of the wafer stage. FIG. 1 shows only one interferometer 18 which is driven in the Y direction in FIG. 1 as a scan direction. Since the wafer stage must move the wafer in units of steps in the X direction after scan exposure, an interferometer and bar mirror may also be arranged in the X direction in FIG. 1 so as to measure the position of the reticle stage along the X- and Y-axes.

The apparatus structure will be described.

A main surface plate 20 is placed on a plurality of legs 19. The main surface plate 20 supports a stage surface plate 21 and lens barrel surface plate 22.

The stage surface plate 21 has a reference surface parallel to the X-Y plane. The wafer stage 15 moves in the X and Y directions along the reference surface. In the first embodiment, the wafer stage 15 is supported by a guide using an air bearing in non-contact with the stage surface plate 21. The guide which supports the wafer stage is not limited to the air bearing, but may be a rolling guide using a ball or roller or a sliding guide.

The lens barrel surface plate 22 supports an air-conditioning duct 23 and cylinder 24 in addition to the projection optical unit 13 and interferometer 18. The interferometer 18 is supported by the lens barrel surface plate 22 which supports the projection optical unit 13, and thus can measure the position of the wafer stage 15 by using the projection optical unit 13 as a reference. The air-conditioning duct 23 sprays gas from a circulation unit (to be described later) via an internal ULPA filter (Ultra Low Penetration Air-filter) 23' in a direction perpendicular to the optical axis of the projection optical unit 13. The air-conditioning duct 23 stabilizes at a predetermined temperature the space almost defined by an interferometer optical path 18' of the interferometer 18, the wafer 14, and the lens barrel surface plate 22. This reduces fluctuation of the interferometer optical path 18' and distortion of an object caused by temperature changes in the space. The air-conditioning duct 23 reduces the concentration of an optical absorber (e.g., oxygen) on the exposure optical path extending from the end of the projection optical unit 13 to the wafer 14.

The above-mentioned reticle stage 9 moves in the Y direction as a scan direction (in some cases, also in the X direction) along the reference surface of the cylinder 24. In the first embodiment, the wafer stage 15 is supported by the guide using an air bearing in non-contact with the cylinder 24. Note that the guide which supports the reticle stage is not limited to the air bearing, and may be a rolling guide using a ball or roller or a sliding guide.

The cylinder 24 surrounds an upper part of the projection optical unit 13 above the upper surface of the lens barrel surface plate 22, and has at the top an opening 24' so as to transmit an exposure beam. The cylinder 24 supports the interferometer 12, an air-conditioning duct 25, and the housing 6 (in FIG. 1, the joint portion between the housing 6 and the cylinder is represented by a broken line), in addition to the reticle stage 9. The interferometer 12 is supported by the cylinder 24 integrated with the projection optical unit 13 and can measure the position of the reticle stage 9 by using the projection optical unit 13 as a reference. The air-conditioning duct 25 sprays gas from a circulation unit (to be described later) via an internal ULPA filter 25' in a direction perpendicular to the optical axis of the projection optical unit 13. The air-conditioning duct 25 stabilizes an interferometer optical path 12' of the interferometer 12, the reticle 8, and a reticle surrounding space at a predetermined temperature. This reduces fluctuation of the interferometer optical path 12' and distortion of an object caused by temperature changes in the reticle surrounding space. The air-conditioning duct 25 reduces the concentration of an optical absorber (e.g., oxygen) on an exposure optical path before and after the reticle 8.

In the first embodiment, a chamber 26 has a closed structure which incorporates the apparatus main body and shields ventilation with outer air. A movable displacement adjusting member 27 is formed from a stainless steel bellows, couples the periphery of the leg 19 to the chamber 26, ensures the sealed state of the chamber 26, and can absorb relative displacement between the leg 19 and the main surface plate 20.

A movable displacement adjusting member 28 is formed from a stainless steel bellows, couples the chambers 4 and 26, ensures the sealed states of the chambers 4 and 26, and can absorb relative displacement between the chambers 4 and 26 on a support table 30.

A movable displacement adjusting member 29 is formed from a stainless steel bellows, couples the chamber 4 to the housing 6, ensures the sealed states of the chamber 4 and housing 6, and can absorb relative displacement between the chamber 4 and the housing 6.

The movable displacement adjusting members 27, 28, and 29 are the stainless steel bellows in the first embodiment, but are not limited to them as far as they can absorb relative displacement. The movable displacement adjusting members 27, 28, and 29 may be nickel-array or titanium metal bellows or resin bellows. Magnetic fluid seals may be adopted in place of the bellows.

A load-lock chamber 31 is used in loading/unloading the reticle 8, and comprises gate valves 32 and 33 freely opened/closed by a driving unit (not shown). A support table 34 is for the reticle 8. A reticle transfer robot 35 supplies/recovers a reticle to/from the reticle holder 10.

A load-lock chamber 36 is used in loading/unloading the wafer 14, and comprises gate valves 37 and 38 freely opened/closed by a driving unit (not shown). A support table 39 is provided for the wafer 14. A wafer transfer robot 40 supplies/recovers a wafer to/from the wafer chuck 16.

Environment control and temperature control methods in the chambers 4 and 26 and load-lock chambers 31 and 36 will be explained.

A gas supply source 51 supplies nitrogen gas or helium gas as an inert gas. The two gases exhibit high transmittances with respect to an $F_2$ laser beam. The gas supply source 51 supplies gas hardly containing oxygen. "Gas hardly containing oxygen" means that the gas does not contain a given amount of oxygen, which greatly influences the performance of the apparatus, and means at least a lower oxygen concentration than an oxygen concentration required for the chamber 4 or the like.

The gas from the gas supply source 51 is guided via a pipe 52 to a gas supply port 53 formed in one end of the chamber 4 on the light source side. After flowing through the chamber 4, the gas is discharged from a gas discharge port 54 formed in the other end of the chamber 4 on the exposure apparatus side, and discharged to a discharge mechanism 56 via a pipe 55.

The gas flow path in the chamber 4 will be explained with reference to FIG. 2. The same reference numerals as in FIG. 1 denote the same parts, and a description thereof will be omitted.

A laser beam emitted by the laser device 1 is reflected by the mirror 2, and shaped into a predetermined beam by a beam shaping optical unit 201. The laser beam irradiates an optical integrator 210 at a predetermined magnification via condenser lenses 204 and 207. The optical integrator 210 is constituted by two-dimensionally arraying microlenses. The laser beam illuminates a conjugate plane 219 with the reticle 8 (FIG. 1) via a condenser lens 213.

The beam shaping optical unit 201 is supported by a support table 202 having a vent hole 203. The condenser lens 204 is supported by a support table 205 having a vent hole 206. The condenser lens 207 is supported by a support table 209 having a vent hole 208. The optical integrator 210 is supported by a support table 211 having a vent hole 212. The condenser lens 213 is supported by a support table 214 having a vent hole 215.

Gas from the gas supply port 53 flows through the chamber 4 along the optical path, sequentially passes through the vent holes 203, 206, 208, 212, and 215 and a vent hole 218, and is discharged from the gas discharge port 54.

Figure 2:
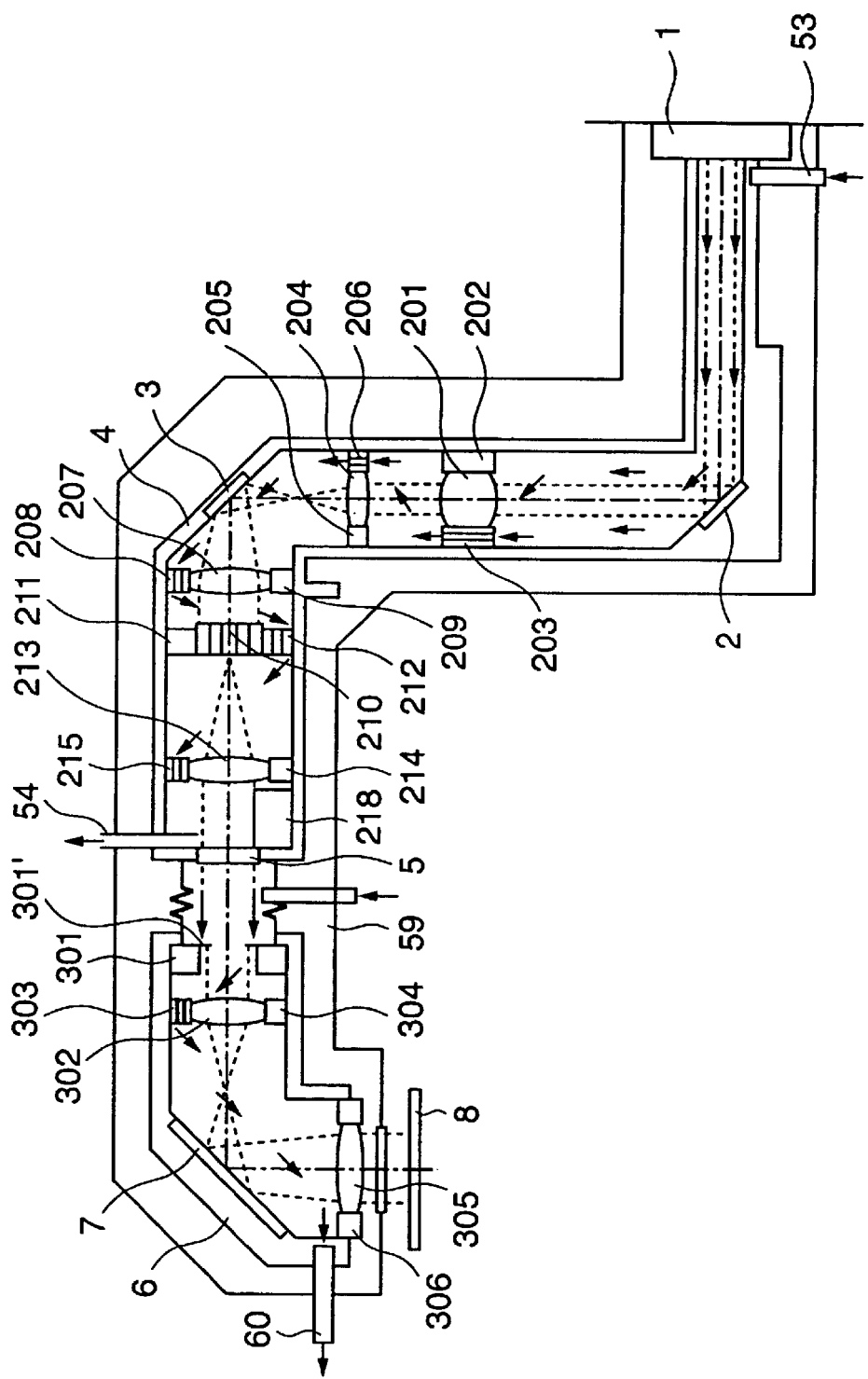
FIG. 2 is a sectional view showing the arrangement of an illumination optical unit according to the present invention.

The concept of the gas flow path in the chamber 4 is indicated by arrows in FIG. 2.

The use of the flow path extending through the space between the optical elements in the chamber 4 enables efficient gas replacement of the atmosphere in the space between the optical elements.

The glass 5 is a plane-parallel plate in the first embodiment, but is not limited to this and may be another transmission element such as a lens or prism. The optical integrator is a fly-eye integrator in the first embodiment, but may be an optical unit using a rod integrator, using a plurality of fly-eye integrators in line, or using a combination of a fly-eye integrator and rod integrator.

The optical unit in the chamber 4 is combined with an optical unit in the housing 6 (to be described later) to form an illumination optical unit for illuminating a reticle.

Referring back to FIG. 1, the exposure apparatus of the first embodiment will be continued.

In FIG. 1, a gas supply source 57 supplies nitrogen gas or helium gas.

The gas from the gas supply source 57 is guided via a pipe 58 to a gas supply port 59 formed in the housing 6 or bellows 29. After flowing through the housing 6, the gas is discharged to the chamber 4 from a gas discharge port 60 formed in one end of the housing 6.

The gas flow path in the housing 6 will be explained with reference to FIG. 2. The same reference numerals as in FIG. 1 denote the same parts, and a description thereof will be omitted.

A masking blade 301 has a rectangular opening which defines the illumination range of the reticle 8. The size of the rectangular opening can be changed by driving using a driving means (not shown) in accordance with the positions of the reticle pattern and reticle 8. A light-shielding plate 301' which defines the rectangular opening of the masking blade 301 is arranged near the conjugate plane 219 with the reticle 8. Condenser lenses 302 and 305 project an image of the rectangular opening formed by the masking blade 301 onto the reticle 8 at a predetermined magnification.

As described above, the optical unit in the housing 6 is combined with the optical unit in the chamber 4 to form part of the illumination optical unit for illuminating the reticle 8.

The light-shielding plate 301' moves along a guide (not shown), and the first embodiment uses an air bearing which is a non-contact bearing. However, the guide is not limited to this, and may employ a rolling guide using a ball or roller or a sliding guide.

The condenser lens 302 is supported by a support table 304 having a vent hole 303, whereas the condenser lens 305 is supported by a support table 306.

Gas from the gas supply port 59 flows through the housing 6 along the optical path, passes through the optical path between the condenser lenses 302 and 305 via the vent hole 303 formed in the support table 304, and is discharged from the gas discharge port 60. The concept of the gas flow path in the housing 6 is indicated by arrows in FIG. 2. The use of the flow path extending through the space between the optical elements in the housing 6 enables efficient gas replacement of the atmosphere in the space between the optical elements.

In the first embodiment, gas discharged from the gas discharge port 60 is directly supplied into the chamber 26, but gas supply is not limited to this. It may also be possible that gas from the gas discharge port 60 is guided to an optical unit inserted in the optical path extending from the housing 6 to the wafer 14, e.g., to the projection optical unit 13, and after flowing through the projection optical unit, the gas is discharged into the chamber 26. Alternatively, gas discharged from the gas discharge port 60 may be directly recovered.

The optical unit in the housing 6 shown in FIG. 2 is an imaging optical unit using a condenser lens unit, but may be a reflection/refraction optical unit or reflection optical unit.

The opening shape of the masking blade 301 is rectangular in the first embodiment, but may be arcuated with a predetermined curvature.

In the first embodiment, the gas supply port 59 is formed in one end of the housing 6 on the light source side, and the gas discharge port 60 is formed in one end of the housing 6 on the reticle side. However, the ports 59 and 60 are not limited to this. For example, it may also be possible that the gas supply port is formed in one end of the housing 6 on the reticle side and the gas discharge port is formed in one end of the housing 6 on the light source side. In some cases, a port having the masking blade serving as a movable displacement adjusting member is desirably set at a downstream side in consideration of the gas purity of the atmosphere in the housing 6.

The above-described gas circulation method is a method of replacing gas in the chamber 4 and housing 6 during exposure. The atmospheres in the chamber 4 and housing 6 are outer air before exposure, so it takes a long time to decrease the oxygen concentration in the optical path only by flowing inert gas.

To solve this, the present invention discharges the originally present outer air by evacuating the interiors of the chamber 4 and housing 6 once or a plurality of number of times before supplying inert gas into the chamber 4 and housing 6.

It is undesirable to deform the chamber 4 owing to the internal/external pressure difference of the chamber 4 when the chamber 4 is evacuated, because the position of an optical element held by the chamber 4 shifts.

To decrease the internal/external pressure differences of the chamber 4 and housing 6, the chamber 4 and housing 6 are surrounded by a closed vessel. The interior of the closed vessel is controlled to be a pressure almost equal to the internal pressures of the chamber 4 and housing 6 in evacuating the interiors of the chamber 4 and housing 6. This can decrease the internal/external pressure differences of the chamber 4 and housing 6 and can suppress deformation of the chamber 4 and housing 6 in evacuation.

The closed vessel will be explained with reference to FIG. 3.

Figure 3:
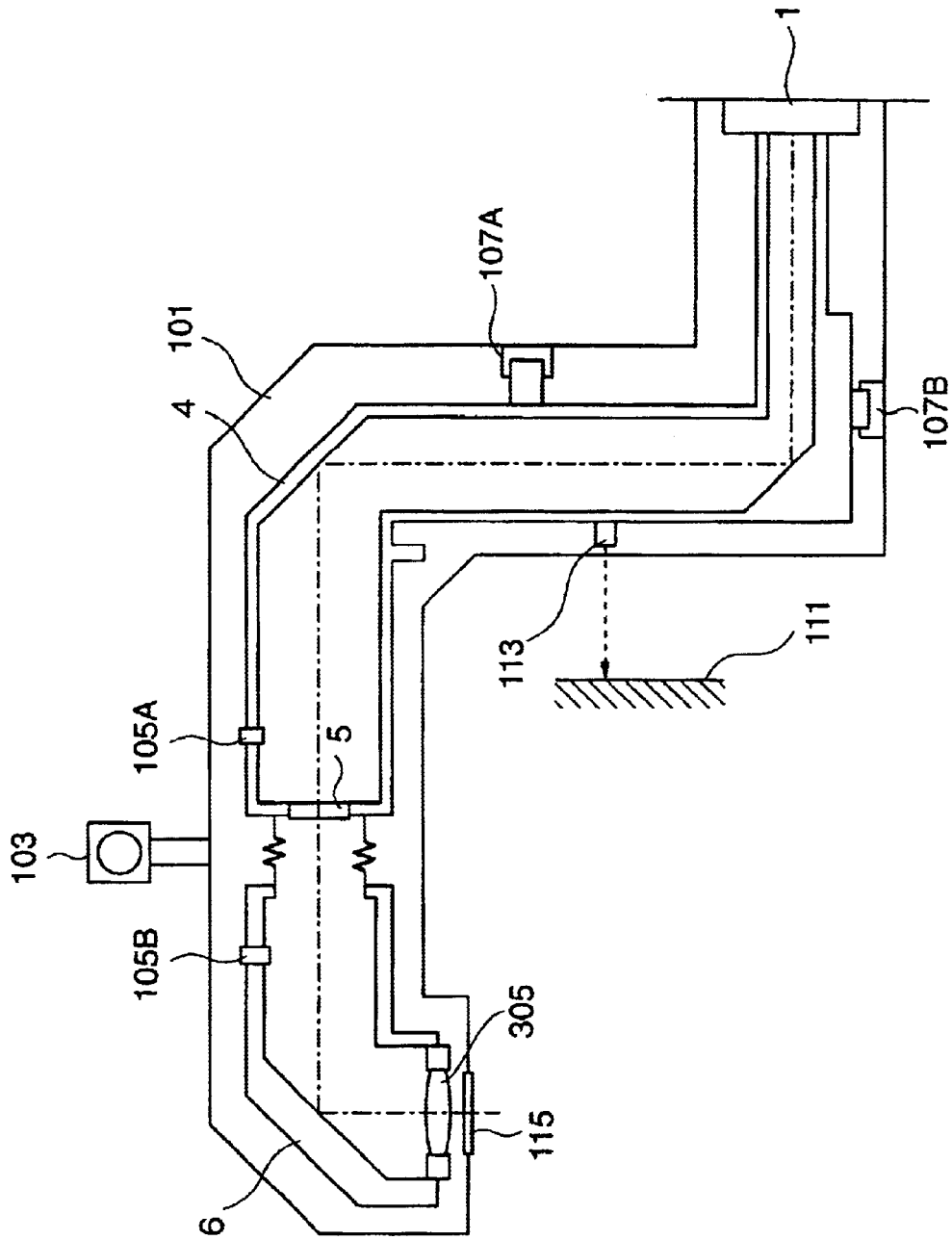
FIG. 3 is a sectional view showing the arrangement of the illumination optical unit according to the present invention.

In FIG. 3, a closed vessel 101 surrounds the chamber 4 and housing 6 having the illumination optical unit. A vacuum pump 103 forcibly discharges gas from the closed vessel 101 and evacuates the closed vessel 101.

A vent hole 105A communicates with the atmospheres in the chamber 4 and closed vessel. When the vacuum pump 103 forcibly discharges gas from the closed vessel 101, the interior of the closed vessel 101 changes to a reduced-pressure atmosphere, and gas in the chamber 4 is discharged to the closed vessel 101 via the vent hole 105A. At the same time as the interior of the chamber 4 is evacuated, the internal pressures of the chamber 4 and closed vessel can be set to be almost equal.

A vent hole 105B communicates with the atmospheres in the housing 6 and closed vessel. When the vacuum pump 103 forcibly discharges gas from the closed vessel 101, the interior of the closed vessel 101 changes to a reduced-pressure atmosphere, and gas in the housing 6 is discharged to the closed vessel 101 via the vent hole 105B. At the same time as the interior of the housing 6 is evacuated, the internal pressures of the housing 6 and closed vessel can be set to be almost equal.

This arrangement enables evacuating the interiors of the chamber 4 and housing 6 and decreasing the internal/external pressure differences of the chamber 4 and housing 6. Deformation of the chamber 4 and housing 6 upon evacuation can be suppressed.

In FIG. 3, the chamber 4 and housing 6 are surrounded by the same closed vessel, but are not limited to this and may be surrounded by separate closed vessels. The closed vessel 101 may also serve as the chamber 26.

Evacuation of the closed vessel 101 may generate the internal/external pressure difference of the closed vessel 101 and may deform it. It is not desirable that deformation of the closed vessel 101 influences the chamber 4 when the closed vessel 101 supports, e.g., the chamber 4. For this reason, the present invention adopts a displacement mechanism for generating a displacement between the closed vessel 101 and the chamber 4.

Displacement mechanisms 107A and 107B generate a displacement between the closed vessel 101 and the chamber 4 depending on deformation of the closed vessel so as not to deform the chamber 4 when the closed vessel 101 deforms. An outer reference member 111 is used as the alignment reference of the illumination optical unit, and an interferometer 113 detects the distance between the chamber 4 and the reference member 111. The displacement mechanisms 107A and 107B are controlled based on position information detected by the interferometer 113.

The displacement mechanisms 107A and 107B desirably control the chamber 4 along six axes. The displacement mechanisms 107A and 107B may support the chamber 4 to the closed vessel. The displacement mechanisms 107A and 107B desirably give a displacement in a non-contact manner.

The displacement mechanisms are illustrated in only the chamber 4 in FIG. 3, but are similarly arranged in the housing 6.

The closed vessel 101 must transmit exposure light in exposure. For this purpose, the present invention provides the closed vessel 101 with a transmission window 115. The transmission window 115 is held to ensure the sealed state in the closed vessel 101, and can resist even the internal/external pressure difference of the closed vessel. The transmission window 115 is made of a fluoride glass material. More specifically, any one of fluorite ($CaF_2$), magnesium fluoride ($MgF_2$), barium fluoride ($BaF_2$), $SrF_2$, and fluorine-doped quartz may be used. These glass materials exhibit high transmittances with respect to light having a wavelength of 157 nm or less. In the first embodiment, the transmission window 115 is a plane-parallel plate, but is not limited to this and may be another transmission element such as a lens, prism, or film.

After the interiors of the chamber 4 and housing 6 are evacuated to discharge outer air present in the chamber 4 and housing 6 from the beginning, inert gas is supplied to the gas supply ports 53 and 59 to circulate the atmospheres in the chamber 4 and housing 6, as described above. At this time, the vent holes 105A and 105B are closed to ensure the gas passage shown in FIG. 2.

Evacuation of the closed vessel may deform the transmission window 115 or cause a positional error. To prevent this, the transmission window 115 may be held by the closed vessel via a bellows (movable displacement adjusting member) so as to be movable with respect to the closed vessel by an actuator (not shown). The bellows of the transmission window is almost identical to the bellows of a transmission window 165 for the projection optical unit (to be described later).

Figure 4:
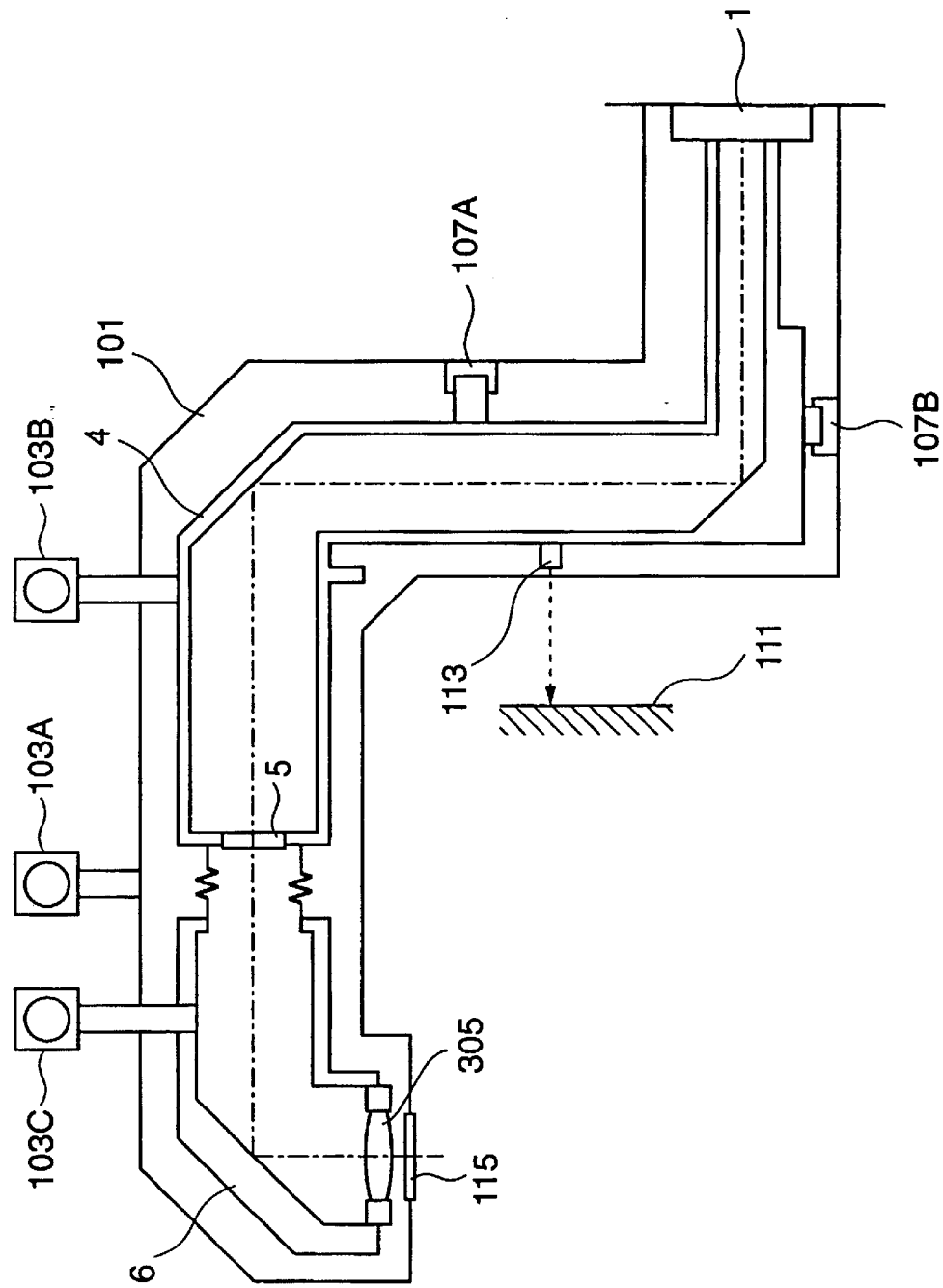
FIG. 4 is a sectional view showing another arrangement of the illumination optical unit according to the present invention.
Figure 6:
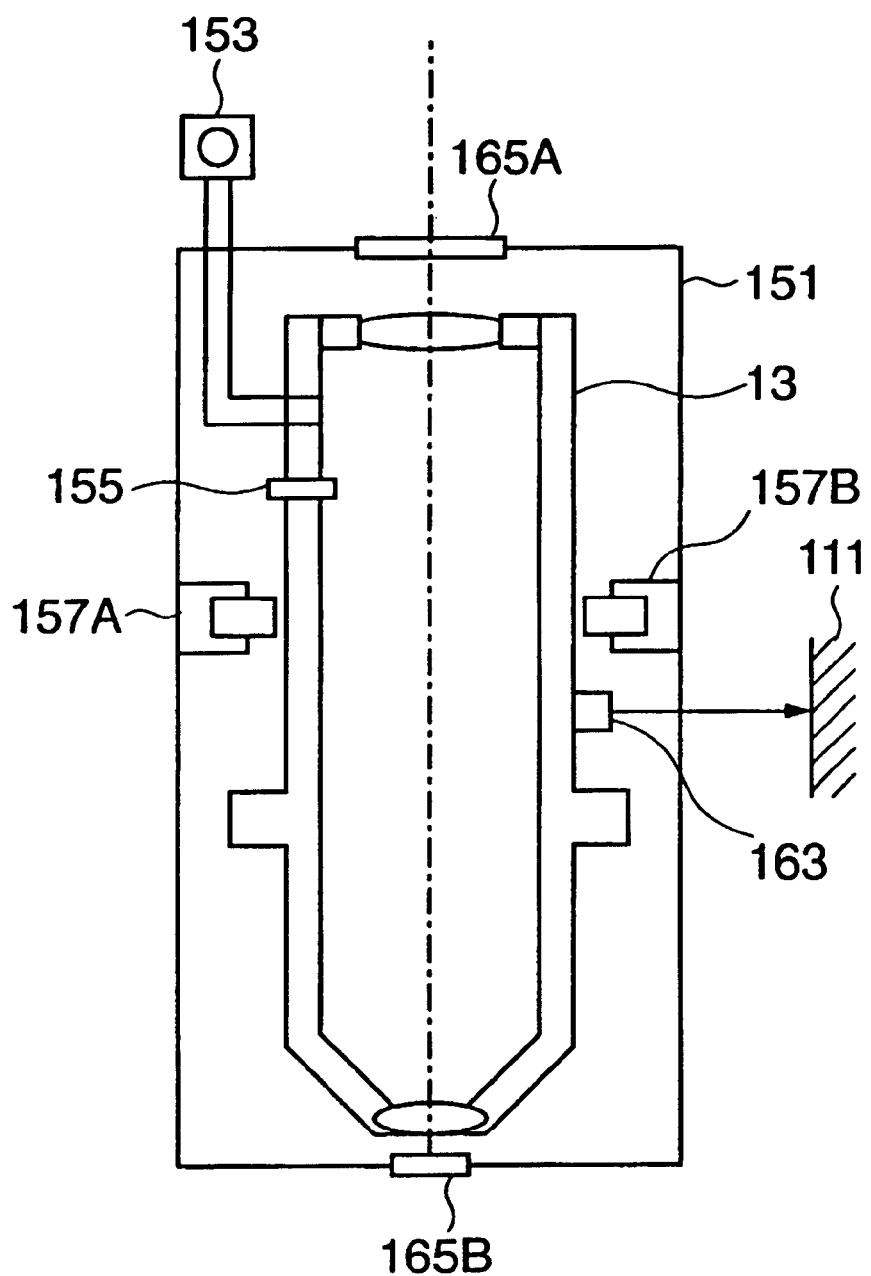
FIG. 6 is a sectional view showing the arrangement of the projection optical unit according to the present invention.

In FIG. 3, the internal pressure differences between the closed vessel 101 and the chamber 4 and housing 6 are reduced via the vent holes 105A and 105B. To reduce the pressure difference, another means can be adopted. For example, as shown in FIG. 4, vacuum pumps 103A, 103B, and 103C are respectively attached to the closed vessel 101, chamber 4, and housing 6, their internal pressures are measured, and the vacuum pumps are controlled based on the measurement result. Alternatively, as shown in FIG. 6, vacuum pumps may be attached to the chamber 4 and housing 6, and vent holes may be formed between the chamber 4 and the closed vessel 101 and between the housing 6 and the closed vessel 101.

In FIG. 3, the sealed state of the closed vessel 101 need not be maintained when the internal pressures of the chamber 4 and housing 6 in exposure are almost the same as the external pressure. In this case, the transmission window 115 formed in the closed vessel 101 may be omitted and replaced by an opening/closing door which is closed in evacuation.

In FIG. 3, especially the purity of inert gas in the chamber 4 and housing 6 must be increased in exposure. For this purpose, the internal pressures of the chamber 4 and housing 6 in exposure may be set positive, which prevents gas flowing from the outside of the chamber 4 and housing 6 and can maintain the purity of inert gas in the chamber 4 and housing 6. By also setting an inert gas atmosphere in the closed vessel 101, a decrease in gas purity in the chamber 4 and housing 6 can be suppressed even if gas flows from the closed vessel 101 into the chamber 4 and housing 6. Hence, an inert gas supply port and discharge port are desirably formed in the closed vessel 101.

The purity need not be as high as those in the chamber 4 and housing 6 even if the closed vessel 101 is filled with inert gas. For example, the purity may be set higher in an order of the inside of the chamber 4 (or housing 6), the inside of the closed vessel 101, and the outside of the closed vessel.

When the internal pressures of the chamber 4 and housing 6 are set positive, as described above, the pressure may be controlled to be higher in an order of the inside of the chamber 4 (or housing 6), the inside of the closed vessel 101, and the outside of the closed vessel.

To evacuate the interiors of the chamber 4 and housing 6 a plurality of number of times, the step of filling the chamber 4 and housing 6 with inert gas is desirably inserted between evacuation steps. Several evacuation processes can reduce the internal/external pressure difference in each evacuation step, can reduce deformation, and can sufficiently decrease the oxygen concentration within a short time.

Referring back to FIG. 1, the exposure apparatus will be described.

In FIG. 1, gas from the gas supply source 57 is guided via a pipe 61 to a gas supply port 62 formed in one end of the projection optical unit 13 on the wafer side. After flowing through the projection optical unit 13, the gas is discharged to the chamber 26 from a gas discharge port 63 formed in the other end of the projection optical unit 13 on the reticle side.

Figure 5:
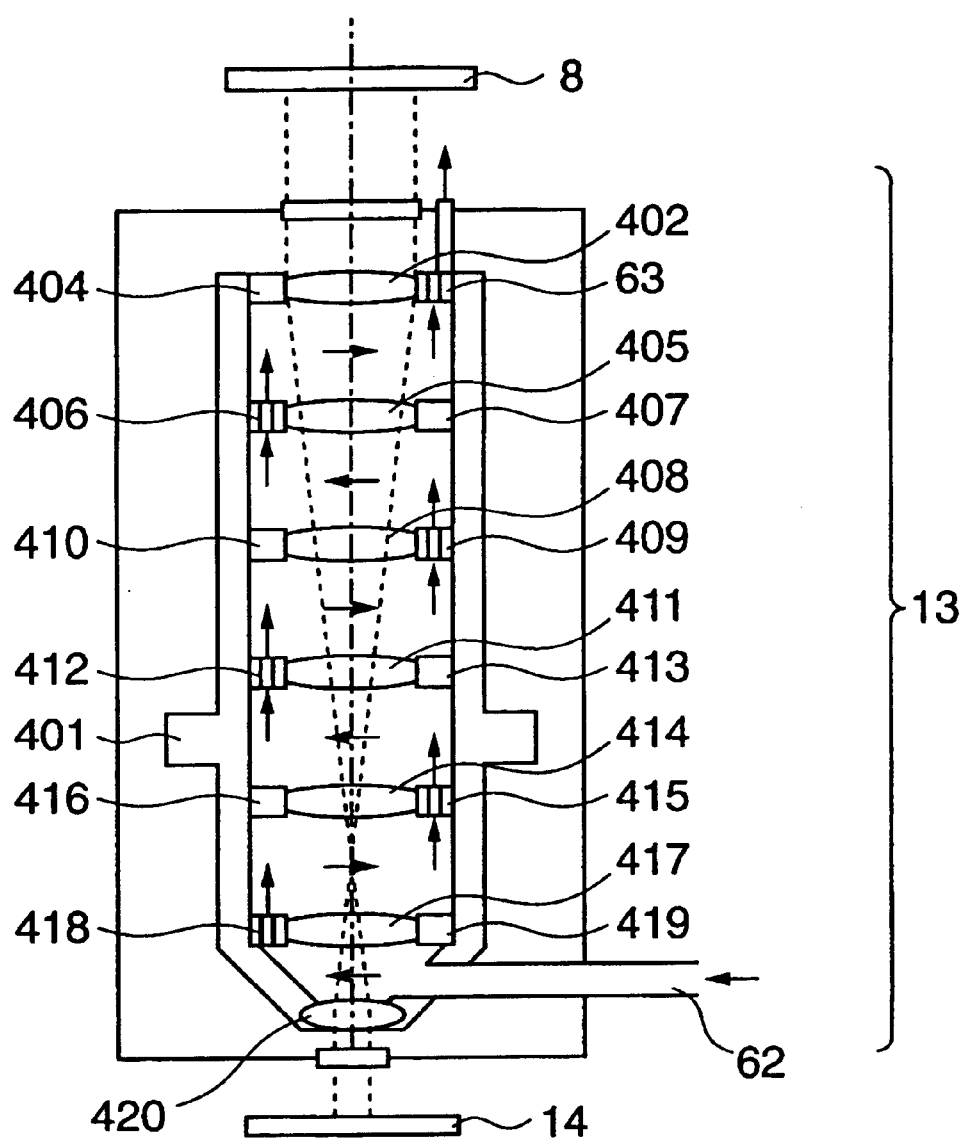
FIG. 5 is a sectional view showing the arrangement of a projection optical unit according to the present invention.

The gas flow path in the projection optical unit 13 will be explained with reference to FIG. 5. The same reference numerals as in FIG. 1 denote the same parts, and a description thereof will be omitted.

A pattern drawn on the reticle 8 is reduced and projected onto the wafer 14 via lenses 402, 405, 408, 411, 414, 417, and 420. Reference numeral 401 denotes a lens barrel of these lenses.

The lens 402 is supported by a support table 404 having the gas discharge port 63. The lens 405 is supported by a support table 407 having a vent hole 406. The lens 408 is supported by a support table 410 having a vent hole 409. The lens 411 is supported by a support table 413 having a vent hole 412. The lens 414 is supported by a support table 416 having a vent hole 415. The lens 417 is supported by a support table 419 having a vent hole 418. The lens 420 and the support table 407, 410, 413, 416, and 419 are supported by the lens barrel 401.

Gas from the gas supply port 62 sequentially passes through the vent holes 418, 415, 412, 409, and 406 formed in the respective support tables, and is discharged from the gas discharge port 63. The concept of the gas flow path in the projection optical unit 13 is indicated by arrows in FIG. 4. The use of the flow path extending through the optical elements in the projection optical unit 13 enables efficient gas replacement of the atmosphere between the optical elements in the projection optical unit 13.

In the first embodiment, gas discharged from the gas discharge port 63 is directly supplied into the chamber 26, but gas supply is not limited to this. It may also be possible that gas from the gas discharge port 63 is guided to an optical unit inserted in the optical path extending from the glass 5 (FIGS. 1 to 4) to the wafer 14, e.g., to the housing 6 (FIGS. 1 and 4), and after flowing through the housing 6, the gas is discharged into the chamber 26. Instead, gas discharged from the gas discharge port 63 may be directly recovered.

The projection optical unit 13 is a refraction optical unit in the first embodiment, but may be a reflection/refraction optical unit or reflection optical unit.

The above-described gas circulation method is a method of replacing gas in the projection optical unit 13 during exposure. The atmosphere in the projection optical unit 13 is outer air before exposure, so it takes a long time to decrease the oxygen concentration in the optical path only by flowing gas.

The present invention discharges the originally present outer air by evacuating the interior of the projection optical unit 13 once or a plurality of number of times before supplying inert gas into the projection optical unit 13.

It is undesirable to deform the projection optical unit 13 owing to the internal/external pressure difference of the projection optical unit 13 when the projection optical unit 13 is evacuated, because the position of the lens of the projection optical unit shifts.

To decrease the internal/external pressure difference of the projection optical unit 13, the projection optical unit 13 is surrounded by a closed vessel. The interior of the closed vessel is controlled to be a pressure almost equal to the internal pressure of the projection optical unit 13 in evacuating the interior of the projection optical unit 13. This can decrease the internal/external pressure difference of the projection optical unit 13 and can suppress deformation of the projection optical unit 13 in evacuation.

The closed vessel will be explained with reference to FIG. 6.

In FIG. 6, a closed vessel 151 surrounds the projection optical unit 13. A vacuum pump 153 forcibly discharges gas from the closed vessel 151 and evacuates the closed vessel 151.

A vent hole 155 communicates with the atmospheres in the projection optical unit 13 and closed vessel 151. When the vacuum pump 153 forcibly discharges gas from the projection optical unit 13, the interior of the projection optical unit 13 changes to a reduced-pressure atmosphere, and gas in the closed vessel 151 is discharged to the projection optical unit 13 via the vent hole 155. At the same time as the interiors of the projection optical unit 13 and closed vessel 151 are evacuated, the internal pressures of the projection optical unit 13 and closed vessel 151 can be set to be almost equal.

This arrangement enables evacuating the interior of the projection optical unit 13 and decreasing the internal/external pressure difference of the projection optical unit 13. Deformation of the projection optical unit 13 upon evacuation can be suppressed.

Note that the closed vessel 151 may also serve as the chamber 26 or cylinder 24.

Evacuation of the closed vessel 151 may generate the internal/external pressure difference of the closed vessel 151 and may deform it. It is not desirable that deformation of the closed vessel 151 influences the projection optical unit 13 when the closed vessel 151 supports the projection optical unit 13. For this reason, the present invention adopts a displacement mechanism for generating a displacement between the closed vessel 151 and the projection optical unit.

Displacement mechanisms 157A and 157B generate a displacement between the closed vessel 151 and the projection optical unit 13 depending on deformation of the closed vessel 151 so as not to deform the projection optical unit 13 when the closed vessel 151 deforms. The outer reference member 111 is used as the alignment reference of the illumination optical unit 13, and an interferometer 163 detects the distance between the projection optical unit 13 and the reference member 111. The displacement mechanisms 157A and 157B are controlled based on position information detected by the interferometer 163.

The displacement mechanisms 157A and 157B desirably control the projection optical unit 13 along six axes. The displacement mechanisms 157A and 157B may support the projection optical unit 13 to the closed vessel 151. The displacement mechanisms 157A and 157B desirably give a displacement in a non-contact manner.

The closed vessel 151 must transmit exposure light in exposure. For this purpose, the present invention provides the closed vessel 151 with transmission windows 165A and 165B. The transmission windows 165A and 165B are held to ensure the sealed state in the closed vessel 151, and can resist even the internal/external pressure difference of the closed vessel 151.

Figure 7:
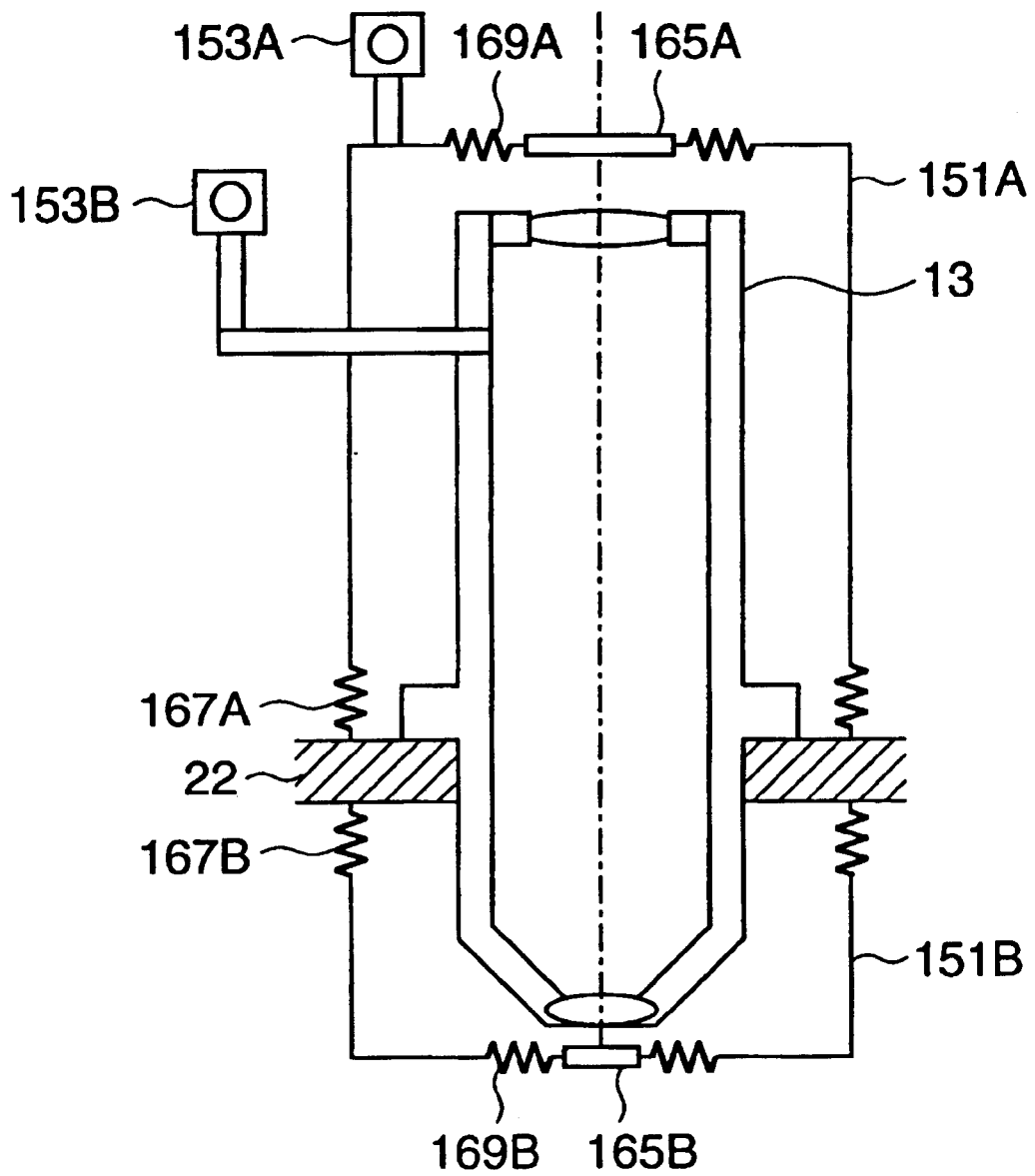
FIG. 7 is a sectional view showing another arrangement of the projection optical unit according to the present invention.

The transmission windows may be held by bellows so as to be movable by an actuator in consideration of deformation of the closed vessel 151, as shown in FIG. 7. The transmission windows 165A and 165B are made of a fluoride glass material. More specifically, any one of fluorite ($CaF_2$), magnesium fluoride ($MgF_2$), barium fluoride ($BaF_2$), $SrF_2$, and fluorine-doped quartz may be used. These glass materials exhibit high transmittances with respect to light having a wavelength of 157 nm or less. In the first embodiment, the transmission windows 165A and 165B are plane-parallel plates, but are not limited to them and may be other transmission elements such as a lens, prism, or film.

After the interior of the projection optical unit 13 is evacuated to discharge outer air present in the projection optical unit 13 from the beginning, inert gas is supplied to the gas supply port 62 to circulate the atmosphere in the projection optical unit 13, as described above. At this time, the vent hole 155 is closed to ensure the gas passage shown in FIG. 5.

In FIG. 6, the internal pressure difference between the closed vessel 151 and the projection optical unit 13 is reduced via the vent hole 155. To reduce the pressure difference, another means can be adopted. For example, similar to the case of FIG. 4, vacuum pumps 153A and 153B are respectively attached to the closed vessel 151 and projection optical unit 13, their internal pressures are measured, and the vacuum pumps are controlled based on the measurement result. Alternatively, similar to the above-mentioned case of FIG. 3, a vacuum pump may be attached to the closed vessel, and a vent hole may be formed between the projection optical unit and the closed vessel.

In FIG. 6, the sealed state of the closed vessel 151 need not be maintained when the internal pressure of the projection optical unit 13 in exposure is almost the same as the external pressure. In this case, the transmission windows 165A and 165B formed in the closed vessel 151 may be omitted and replaced by an opening/closing door which is closed in evacuation.

In FIG. 6, especially the purity of inert gas in the projection optical unit 13 must be increased in exposure. For this purpose, the internal pressure of the projection optical unit 13 in exposure may be set positive, which prevents gas flowing from the outside of the projection optical unit 13 and can maintain the purity of inert gas in the projection optical unit 13. By also setting an inert gas atmosphere in the closed vessel 151, a decrease in gas purity in the projection optical unit 13 can be suppressed even if gas flows from the closed vessel 151 into the projection optical unit 13. Thus, an inert gas supply port and discharge port are desirably formed in the closed vessel 151.

The purity need not be as high as that in the projection optical unit 13 even if the closed vessel 151 is filled with inert gas. For example, the purity may be set higher in an order of the inside of the projection optical unit 13, the inside of the closed vessel 151, and the outside of the closed vessel.

When the internal pressure of the projection optical unit 13 is set positive, as described above, the pressure may be controlled to be higher in an order of the inside of the projection optical unit 13, the inside of the closed vessel 151, and the outside of the closed vessel.

To evacuate the interior of the projection optical unit 13 a plurality of number of times, the step of filling the projection optical unit 13 with inert gas is desirably inserted between evacuation steps. Several evacuation processes can reduce the internal/external pressure difference in each evacuation step, can reduce deformation, and can sufficiently decrease the oxygen concentration within a short time.

A modification of the closed vessel which surrounds the projection optical unit will be explained with reference to FIG. 7. In FIG. 7, the same reference numerals as in FIG. 6 denote the same parts, and a description thereof will be omitted.

In FIG. 7, the projection optical unit 13 is supported by the lens barrel surface plate 22. A closed vessel 151A surrounds an upper part of the projection optical unit 13 above the lens barrel surface plate 22. A closed vessel 151B surrounds a lower part of the projection optical unit 13 below the lens barrel surface plate 22. Although not shown, the internal spaces of the closed vessels 151A and 151B communicate with each other.

A vacuum pump 153A evacuates the space between the closed vessels 151A and 151B and the projection optical unit 13, whereas a vacuum pump 153B exhausts gas from the projection optical unit 13. Similar to the above-described case, the internal pressures of the projection optical unit 13 and closed vessel 151 are set to be almost equal. Also, similar to the above-described case, it may be possible to form vent holes and attach a vacuum pump to either hole.

Evacuation of the closed vessels 151A and 151B may generate the internal/external pressure differences of the closed vessel 151A and 151B and may deform them. It is not preferable that deformation of the closed vessels 151A and 151B influence the projection optical unit 13.

In the example of FIG. 7, the closed vessel 151A is coupled to the lens barrel surface plate 22 via a stainless steel bellows 167A serving as a movable displacement adjusting member so as to keep a sealed state. Similarly, the closed vessel 151B is coupled via a stainless steel bellows 167B serving as a movable displacement adjusting member so as to keep a sealed state. This structure prevents the influence of deformation on the lens barrel surface plate even if the closed vessels 151A and 151B deform due to the internal/external pressure differences of the closed vessels 151A and 151B. Therefore, deformation of the closed vessels 151A and 151B does not influence the projection optical unit 13. The lens barrel surface plate 22 hardly deforms even when the internal pressures of the closed vessels 151A and 151B are reduced. For this reason, the influence of deformation on the projection optical unit 13 is reduced even after the interiors of the closed vessels 151A and 151B are evacuated.

Deformation of the closed vessels 151A and 151B may deform the transmission windows 165A and 165B formed in the closed vessels or cause a positional error. To solve this, the transmission windows 165A and 165B are held movably with respect to the closed vessels 151A and 151B via bellows 169A and 169B (movable displacement adjusting members) so as to be movable with respect to the closed vessels by actuators (not shown). If the closed vessels 151A and 151B deform, the actuators position the transmission windows 165A and 165B so as to attain a predetermined positional relationship with the projection optical unit 13. Note that the holding means of the transmission windows 165A and 165B are not limited to the bellows as far as the transmission windows 165A and 165B can be held movably with respect to the closed vessels 151A and 151B while maintaining an airtight state in the closed vessels.

If the above-mentioned opening/closing doors are exploited in place of the transmission windows 165A and 165B, the bellows 169A and 169B can be omitted.

Referring back to FIG. 1, the exposure apparatus will be described.

Gas discharged from the gas discharge ports 60 and 63 into the chamber 26 is discharged from a circulation outlet port 70 of the chamber 26, and guided to an inlet port 73 of a gas circulation unit 72 via a pipe 71. Gases distributed to predetermined flow rates in the gas circulation unit 72 are respectively discharged from distribution ports 74a, 74b, 74c, and 74d of the gas circulation unit 72.

The gas discharged from the distribution port 74a is guided via a pipe 75a to a down-flow duct 76 which makes almost all the gas in the chamber 26 flow down, and is sprayed into the chamber 26 via a ULPA filter 76' in the down-flow duct 76.

The gas discharged from the distribution port 74b is guided to the partial duct 25 via a pipe 75b and sprayed into the space near the reticle 8 and interferometer optical path 12', as described above.

The gas discharged from the distribution port 74c is guided to a gas inlet port 41 of the cylinder 24 via a pipe 75c, passes through the space between the projection optical unit 13 and the cylinder 24, and discharged into the chamber 26 via an opening 24' of the cylinder 24.

The gas discharged from the distribution port 74d is guided to the partial duct 23 via a pipe 75d and sprayed into the space near the wafer 14 and interferometer optical path 18', as described above.

Although not shown, the gas circulation unit 72 comprises a chemical filter for removing an impurity in the gas from the inlet port.

The gas circulation unit 72 incorporates a temperature regulator (not shown). The temperature regulator controls the temperature to a predetermined one in accordance with an instruction from a controller 78 on the basis of the detection results of thermometers 77a to 77d in the exposure apparatus.

Gas from the gas supply source 57 may be controlled to a predetermined temperature in the gas supply source 57 in advance, or the pipe layout may be determined to adjust gas to a predetermined temperature until reaching the gas supply ports 59 and 62 through the space where the pipes 58 and 61 are temperature-controlled in the above way.

In FIG. 1, a high-pressure gas supply device 79 recovers part of gas in the chamber 26 through a pipe 80, raises the gas pressure to a predetermined one, and then supplies gas to the air bearing (not shown) of the wafer stage 15 via a pipe 81a, the air bearing (not shown) of the reticle stage 9 via a pipe 81b, and the air bearing (not shown) of the masking blade 301 (FIG. 4) via a pipe 81c. Since inert gas as purge gas in the chamber 26 is used as a working fluid for the air bearings, the environment in the chamber 26 can be kept at a predetermined state.

Figure 8:
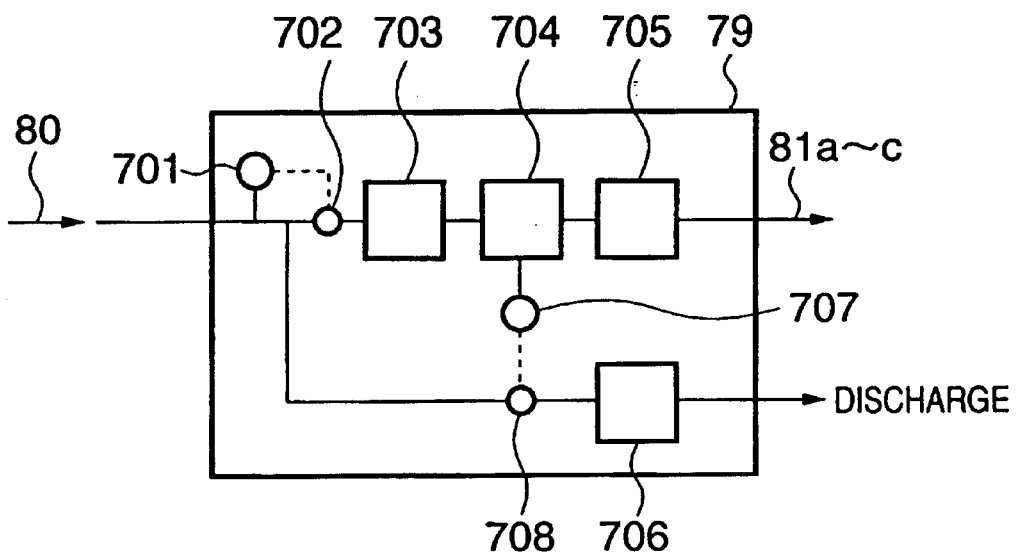
FIG. 8 is a view for explaining a partial arrangement in FIG. 1.

The schematic internal arrangement of the high-pressure gas supply device 79 will be described with reference to FIG. 8.

Gas is controlled to a predetermined flow rate by detecting the pressure of gas from the pipe 80 by a pressure gauge 701 and controlling a control valve 702 by the controller 78 (FIG. 1). The gas controlled to the predetermined flow rate by the control valve is stored in a buffer tank 704 via a recovery pump 703, pressurized to a predetermined pressure by a compressor 705, and supplied to the pipes 81a to 81c. The gas flow path is branched between the pressure gauge 701 and the control valve 702, and the gas is discharged by a discharge pump 706. This discharge amount is controlled by mass-flow controller 708 in accordance with the detection result of a pressure gauge 707 attached to the buffer tank 704 if discharge becomes necessary. The mass-flow controller 708 is controlled by the controller 78 (FIG. 1) based on the detection result of the pressure gauge 707.

This arrangement can always control the internal pressure of the chamber 26 to be constant. Accordingly, optical characteristics readily influenced by variations in pressure, e.g., the performance of the projection optical unit 13 (FIG. 1) can be maintained.

Also, the relative pressure difference between the internal and external pressures of the chamber 26 can be kept at a predetermined value. This can be achieved by using the pressure gauge 701 as a differential pressure gauge and detecting the pressure difference between the internal and external pressures of the pipe 80 (i.e., chamber 26).

Furthermore, the relative pressure difference between the chamber 26 and the chamber 4 can be kept at a predetermined value. This can be achieved by detecting the relative pressure difference between the pipe 80 (i.e., chamber 26) and the chamber 4 by the differential pressure.

The chamber 26 may be given the function of the closed vessel 101 or 151.

In FIG. 1, gas from the gas supply source 57 is supplied to the wafer load-lock chamber 36 via a pipe 82. While replacing the interior, the gas is discharged to a discharge mechanism 86 via a pipe 83. Similarly, gas from the gas supply source 57 is supplied to the reticle load-lock chamber 31 via a pipe 84. While replacing the interior, the gas is discharged to the discharge mechanism 86 via a pipe 85.

Gas is supplied at a timing when the gate valves 32 and 37 are opened, a reticle and wafer are placed on the support tables 34 and 39, the gate valves 32 and 37 are closed, and the valve (not shown) of the gas supply source and the valve (not shown) of the discharge mechanism 86 are opened in accordance with an instruction from the controller 78.

After the interiors of the load-lock chambers 31 and 36 attain a predetermined state, the valves are closed to stop gas supply in accordance with an instruction from the controller 78. Then, the gate valves 33 and 38 are opened, and the reticle 8 and wafer 14 are loaded into the apparatus by the transfer means 35 and 40.

To unload the reticle 8 and wafer 14 from the apparatus, gas supply starts while the gate valves 32, 33, 37, and 38 are kept closed. If the interiors of the load-lock chambers reach a predetermined state, gas supply is stopped. After that, the gate valves 33 and 38 are opened, and the reticle 8 and wafer 14 are unloaded by the transfer means 35 and 40 and placed on the support tables 34 and 39 in the load-lock chambers 31 and 36. After placement, the gate valves 33 and 38 are closed, the gate valves 32 and 37 are opened, and the reticle 8 and wafer 14 are unloaded by means (not shown).

In the above description, the reticle 8 and wafer 14 are simultaneously loaded and unloaded into and from the apparatus. Needless to say, the reticle 8 and wafer 14 can be individually loaded and unloaded.

As is well known, the load-lock chambers 31 and 36 undergo gas replacement in order not to influence the environment in the chamber 26 in opening the gate valves 33 and 38.

To use a pellicle (not shown) in order to prevent attachment of dust to the pattern surface of the reticle 8, it is desirable to replace, by purge gas, the space defined by the reticle 8, the pellicle, and a pellicle frame (not shown) for supporting the pellicle and to use an equipressure perforated pellicle frame (pellicle frame with vent holes for communicating the inside and outside of the pellicle frame).

A discharge port 87 is provided for discharging gas from the chamber 26.

At the start of operating the apparatus, the interiors of the chamber 26 and gas circulation unit 72 are in an outer air state.

In activating the apparatus, gas supply from the gas supply source 57 to the projection optical unit 13 and housing 6 starts. At the same time, discharge to the discharge mechanism 86 is done from the discharge port 87 via a pipe 88. This discharge operation starts/stops by controlling the valve (not shown) of the discharge means 86 by the controller 78.

When the interiors of the chamber 26 and circulation unit reach a predetermined replacement state, discharge from the discharge port 87 stops, and an exposure operation enable state is set.

It is possible that the controller 78 automatically determines the timing when discharge from the discharge port 87 stops, depending on whether a predetermined time has elapsed after the start of discharge, and sends a discharge stop instruction. It may also be possible that a gas sensor (not shown) is arranged at a predetermined portion in the chamber 26 or circulation unit and that the controller 78 automatically determines the discharge stop timing on the basis of the detection result and sends a discharge stop instruction.

In some cases, the replacement states of the chambers 4 and 26 are wanted to be changed to predetermined states within a shorter time at the start of operating the apparatus, or replacement is wanted to be completed within a shorter time so as to increase the throughput because release to outer air and replacement are repeated in the load-lock chambers 31 and 36 every time a reticle and wafer are exchanged. For this purpose, vacuum pumps are used to forcibly discharge outer air from the discharge means 56 and 86, the interiors of the chambers 4 and 26 and those of the load-lock chambers 31 and 36 are evacuated, and then gas purge is performed by the above-described method. In this case, the chambers 4 and 26 and the load-lock chambers 31 and 36 must be rigid enough not to influence deformation on the apparatus performance in a vacuum state.

The embodiment of FIG. 1 uses the movable displacement adjusting members 27, 28, and 29, which can prevent direct influence of deformation of an adjacent building component even if the chambers 4 and 26 deform in a vacuum.

A series of gas supply operations after evacuating the interiors of the chambers and load-lock chambers may be repeated a plurality of number of times, as needed. When evacuation is repeated a plurality of number of times, the ultimate degree of vacuum in the chambers and load-lock chambers suffices to be relatively lower (higher absolute pressure) than that in only one evacuation. This can greatly reduce the costs of vacuum pumps and vacuum components. According to the replacement method of the present invention, it is desirable to introduce helium after the end of the last evacuation and to use nitrogen for a preceding purge.

Figure 14:
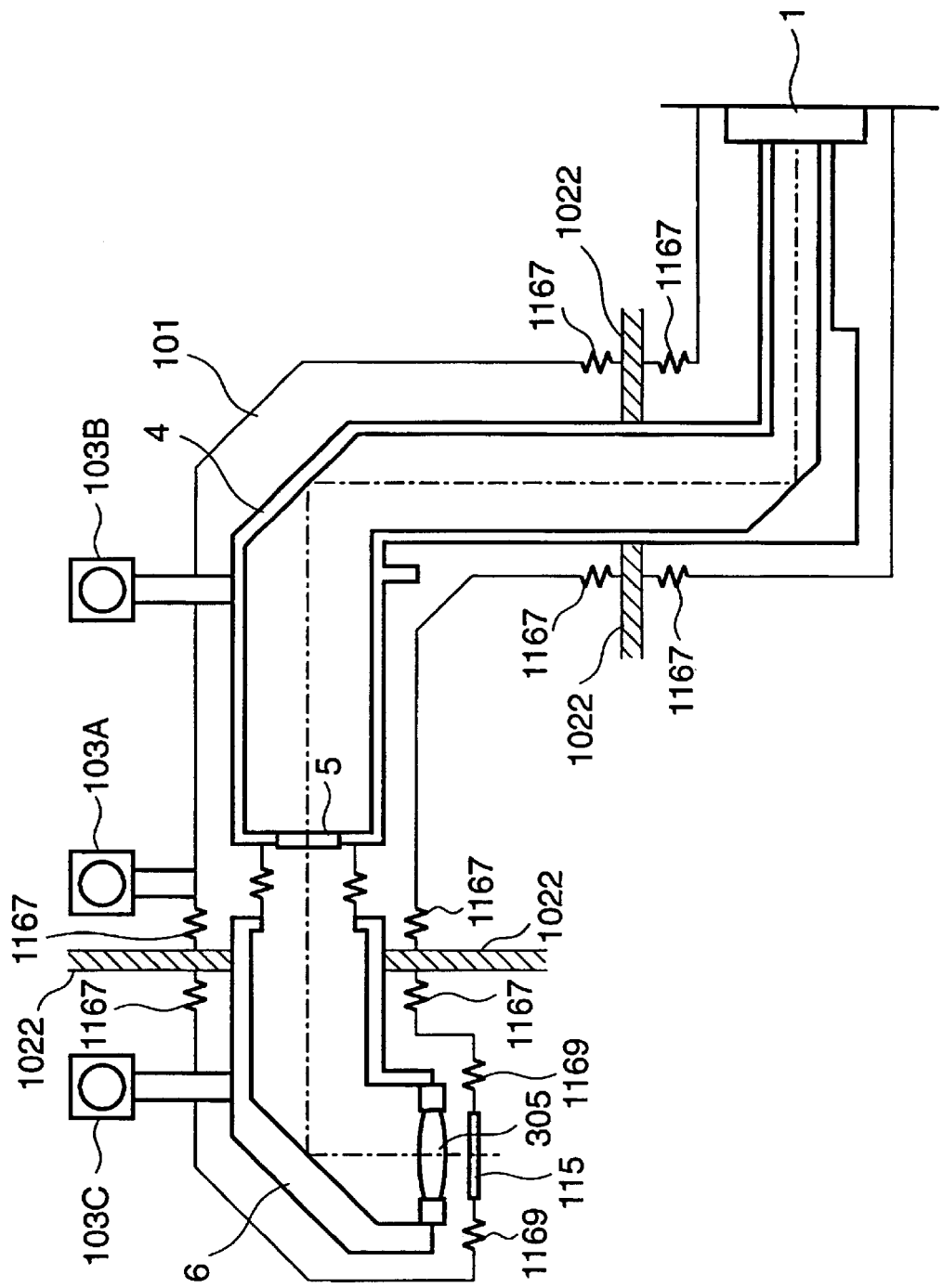
FIG. 14 is a view for explaining the second embodiment according to the present invention.

In the second embodiment, the chamber 4 and housing 6 which constitute the illumination optical unit are supported by the illumination unit surface plate 1022 (FIG. 14). The illumination unit surface plate 1022 may be integrated with the lens barrel surface 22 (refer to FIG. 7, in the first embodiment), which holds the projection optical unit 13.

According to the embodiment of FIG. 1, the chamber 26 can maintain a purge state even if the interior of the chamber 4 is released to outer air for maintenance or the like. To the contrary, the chamber 4 can maintain a purge state even if the interior of the chamber 26 is released to outer air.

Second Embodiment

FIG. 14 is a view for explaining the second embodiment according to the present invention. A modification of a closed vessel which surrounds an illumination optical unit will be described with reference to FIG. 14.

In FIG. 14, the same reference numerals as in FIG. 3 denote the same parts, and a description thereof will be omitted.

In FIG. 14, a chamber 4 and housing 6 which constitute an illumination optical unit are supported by an illumination unit surface plate 1022. A closed vessel 101 surrounds the chamber 4 and housing 6.

A vacuum pump 103A evacuates the internal space between the closed vessel 101 and the chamber 4 and housing 6. Similarly, a vacuum pump 103B evacuates the interior of the chamber 4, and a vacuum pump 103C evacuates the interior of the housing 6. As a result, the internal pressures of the chamber 4 and housing 6 can be set almost equal to that of the closed vessel 101.

As described in the first embodiment, it may be possible to form vent holes between the chamber 4 and the closed vessel 101 and between the housing 6 and the closed vessel 101 and to attach a vacuum pump to either hole.

Evacuation of the closed vessel 101 may generate the internal/external pressure difference of the closed vessel 101 and may deform it. It is undesirable that deformation of the closed vessel 101 influence the chamber 4 and housing 6. In the arrangement of FIG. 14, therefore, the closed vessel 101 and illumination unit surface plate 1022 are coupled via a stainless steel bellows 1167 serving as a movable displacement adjusting member while maintaining a sealed state by absorbing deformation caused by the pressure difference.

Even if the closed vessel 101 deforms due to the internal/external pressure difference of the closed vessel 101, this deformation does not influence the surface plate. Deformation of the closed vessel 101 does not influence the chamber 4 and housing 6.

The illumination unit surface plate 1022 hardly deforms even when the internal pressure of the closed vessel 101 is reduced. The influence of deformation of the illumination unit surface plate 1022 on the chamber 4 and housing 6 is weak even after the interior of the closed vessel 101 is evacuated.

Deformation of the closed vessel 101 may deform a transmission window 115 formed in the closed vessel or cause a positional error. To prevent this, the transmission window 115 is held movably with respect to the closed vessel 101 via a bellows 1169 serving as a movable displacement adjusting member so as to be movable with respect to the closed vessel 101 by an actuator (not shown). If the closed vessel 101 deforms owing to the internal/external pressure difference, the actuator can position the transmission window 115 so as to attain a predetermined positional relationship with the housing 6.

Note that the holding means of the transmission window 115 is not limited to the bellows as long as the transmission window 115 can be held movably with respect to the closed vessel 101 while maintaining an airtight state in the closed vessel.

When an opening/closing door which is closed by a negative pressure in evacuation is used instead of the transmission window 115, as described in the first embodiment, the bellows 1169 can be omitted.

Alignment by displacement mechanisms 107A and 107B in FIG. 3 is not required in a case wherein a reference member 111 as shown in FIG. 3 is rigidly connected to the surface plate 1022.

In the second embodiment, the chamber 4 and housing 6 which constitute the illumination optical unit are supported by the illumination unit surface plate 1022 (FIG. 14). The illumination unit surface plate 1022 may be intergrated with the lens barrel surface 22 (refer to FIG. 7, in the first embodiment), which holds the projection optical unit 13.

Moreover, in the second embodiment, the closed vessel 101 (FIG. 14) may be formed with the same constitution of the closed vessel 151A and 151B (refer to FIG. 7, in the first embodiment).

Furthermore, the constitution which surrounds the chamber with the closed vessel, is not limited to the object units, i.e., the projection optical unit and the illumination unit. For instance, it is possible that the reticle stage unit and the wafer stage unit are applied as object units. And the closed vessel, for the reticle stage unit and the wafer stage unit, may be formed with the same constitution of the closed vessel 151A and 151B.

Embodiment of Semiconductor Production System

A production system for producing a semiconductor device (e.g., a semiconductor chip such as an IC or an LSI, a liquid crystal panel, a CCD, a thin-film magnetic head, a micromachine, or the like) will be exemplified. A trouble remedy or periodic maintenance of a manufacturing apparatus installed in a semiconductor manufacturing factory, or maintenance service such as software distribution is performed by using a computer network outside the manufacturing factory.

Figure 9:
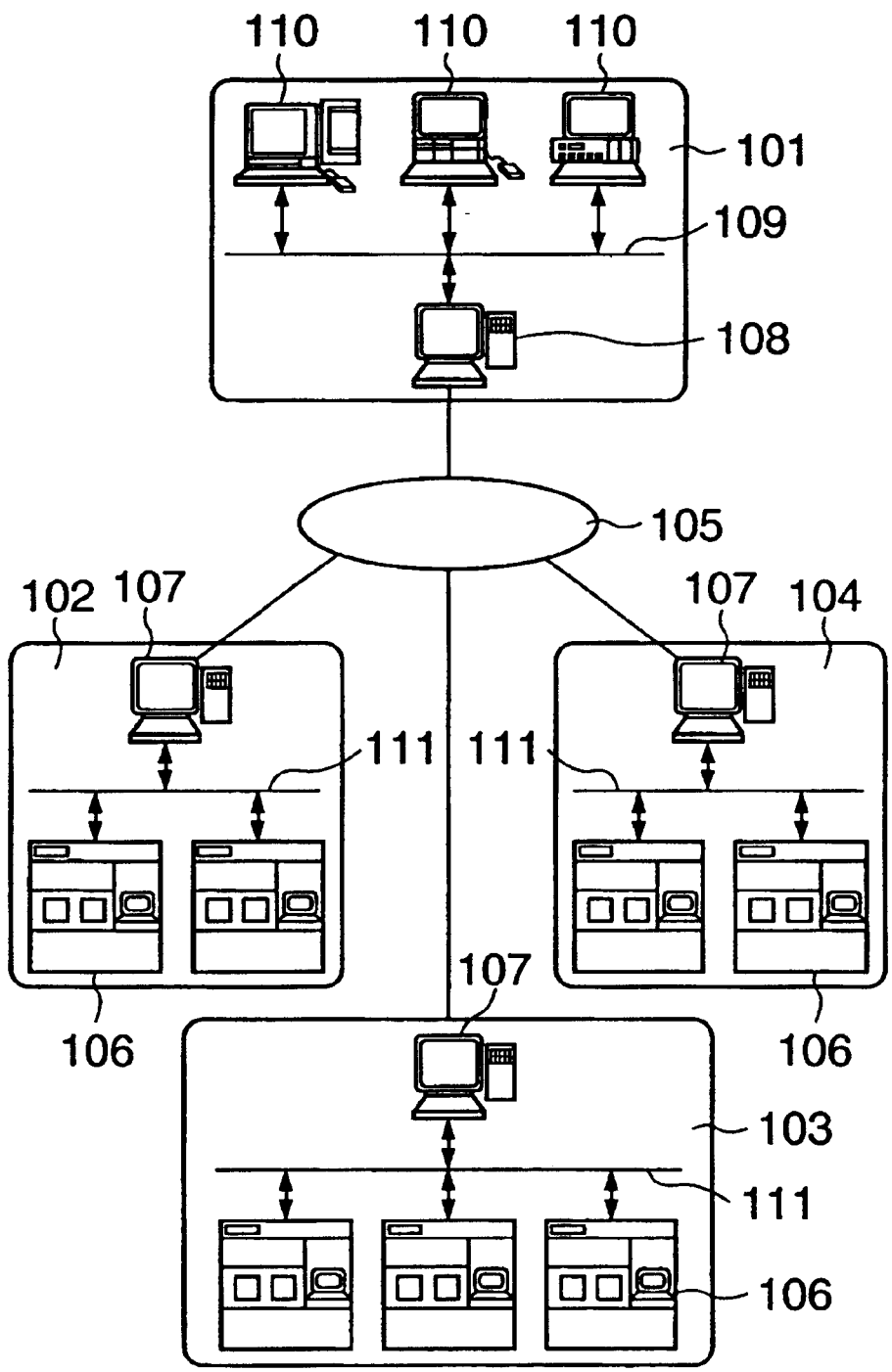
FIG. 9 is a schematic view showing the overall system of a computer network.

FIG. 9 shows the overall system cut out at a given angle. In FIG. 9, reference numeral 1101 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 1101 comprises a host management system 1108 for providing a maintenance database for the manufacturing apparatus, a plurality of operation terminal computes 1110, and a LAN (Local Area Network) 1109 which connects the host management system 1108 and computers 1110 to construct an intranet. The host management system 1108 has a gateway for connecting the LAN 1109 to Internet 1105 as an external network of the business office, and a security function for limiting external accesses.

Reference numerals 1102 to 1104 denote manufacturing factories of the semiconductor manufacturer as users of manufacturing apparatuses. The manufacturing factories 1102 to 1104 may belong to different manufacturers or the same manufacturer (pre-process factory, post-process factory, and the like). Each of the factories 1102 to 1104 is equipped with a plurality of manufacturing apparatuses 1106, a LAN (Local Area Network) 1111 which connects these apparatuses 1106 to construct an intranet, and a host management system 1107 serving as a monitoring apparatus for monitoring the operation status of each manufacturing apparatus 1106. The host management system 1107 in each of the factories 1102 to 1104 has a gateway for connecting the LAN 1111 in the factory to the Internet 1105 as an external network of the factory. Each factory can access the host management system 1108 of the vendor 1101 from the LAN 1111 via the Internet 1105. The security function of the host management system 1108 authorizes access of only a limited user. More specifically, the factory notifies the vender via the Internet 1105 of status information (e.g., the symptom of a manufacturing apparatus in trouble) representing the operation status of each manufacturing apparatus 1106. The factory can receive, from the vender, response information (e.g., information designating a remedy against the trouble, or remedy software or data) corresponding to the notification, or maintenance information such as the latest software or help information.

Data communication between the factories 1102 to 1104 and the vender 1101 and data communication via the LAN 1111 in each factory adopt a communication protocol (TCP/IP) generally used in the Internet. Instead of using the Internet as an external network of the factory, a dedicated-line network (e.g., ISDN) having high security which inhibits access of a third party can be adopted.

It is also possible that the user constructs a database in addition to one provided by the vendor and sets the database on an external network and that the host management system authorizes access to the database from a plurality of user factories.

Figure 10:
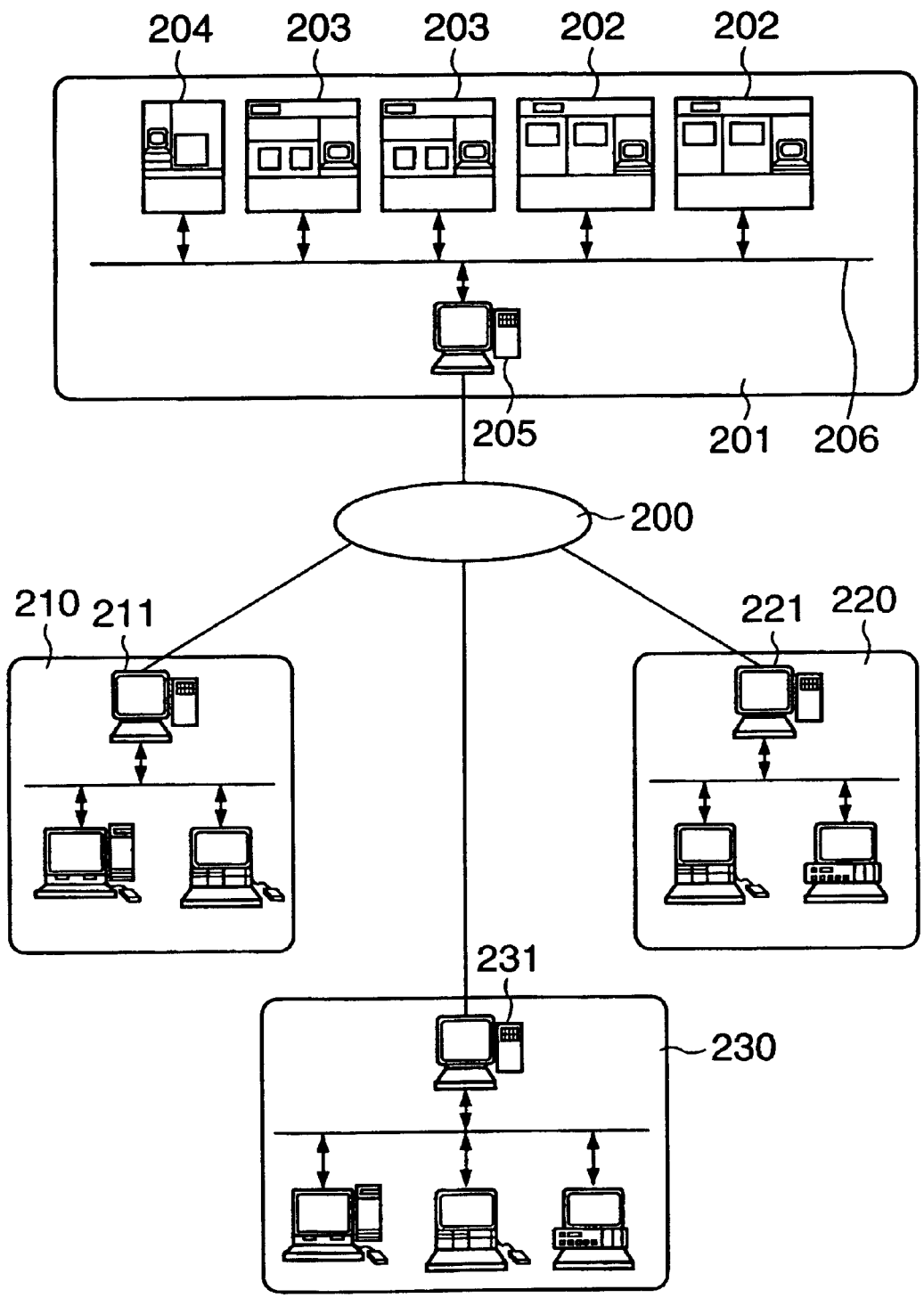
FIG. 10 is a schematic view showing the overall system of the computer network.

FIG. 10 is a view showing the concept of the overall system of this embodiment that is cut out at a different angle from FIG. 9. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 10, a factory having manufacturing apparatuses of a plurality of vendors, and the management systems of the vendors for these manufacturing apparatuses are connected via the external network of the factory, and maintenance information of each manufacturing apparatus is communicated.

In FIG. 10, reference numeral 1201 denotes a manufacturing factory of a manufacturing apparatus user (semiconductor device manufacturer) where manufacturing apparatuses for performing various processes, e.g., an exposure apparatus 1202, a resist processing apparatus 1203, and a film formation apparatus 1204 are installed in the manufacturing line of the factory. FIG. 10 shows only one manufacturing factory 1201, but a plurality of factories are networked in practice.

The respective apparatuses in the factory are connected to a LAN 1206 to construct an intranet, and a host management system 1205 manages the operation of the manufacturing line. The business offices of vendors (apparatus supply manufacturers) such as an exposure apparatus manufacturer 1210, resist processing apparatus manufacturer 1220, and film formation apparatus manufacturer 1230 comprise host management systems 1211, 1221, and 1231 for executing remote maintenance for the supplied apparatuses. Each host management system has a maintenance database and a gateway for an external network, as described above.

The host management system 1205 for managing the apparatuses in the manufacturing factory of the user, and the management systems 1211, 1221, and 1231 of the vendors for the respective apparatuses are connected via the Internet or dedicated-line network serving as an external network 1200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 1200. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 11 on the display. While referring to this window, the operator who manages manufacturing apparatuses in each factory inputs, in input items on the windows, pieces of information such as the type of manufacturing apparatus (1401), serial number (1402), subject of trouble (1403), occurrence date (1404), degree of urgency (1405), symptom (1406), remedy (1407), and progress (1408). The pieces of input information are transmitted to the maintenance database via the Internet, and appropriate maintenance information is sent back from the maintenance database and displayed on the display. The user interface provided by the web browser realizes hyperlink functions (1410 to 1412), as shown in FIG. 11. This allows the operator to access detailed information of each item, receive the latest-version software to be used for a manufacturing apparatus from a software library provided by a vendor, and receive an operation guide (help information) as a reference for the operator in the factory.

Maintenance information provided by the maintenance management system includes information about the oxygen concentration in a chamber. The software library also provides the latest-version software for realizing switching of a gas supply device, control of the oxygen concentration in a chamber, and the like.

Figure 12:
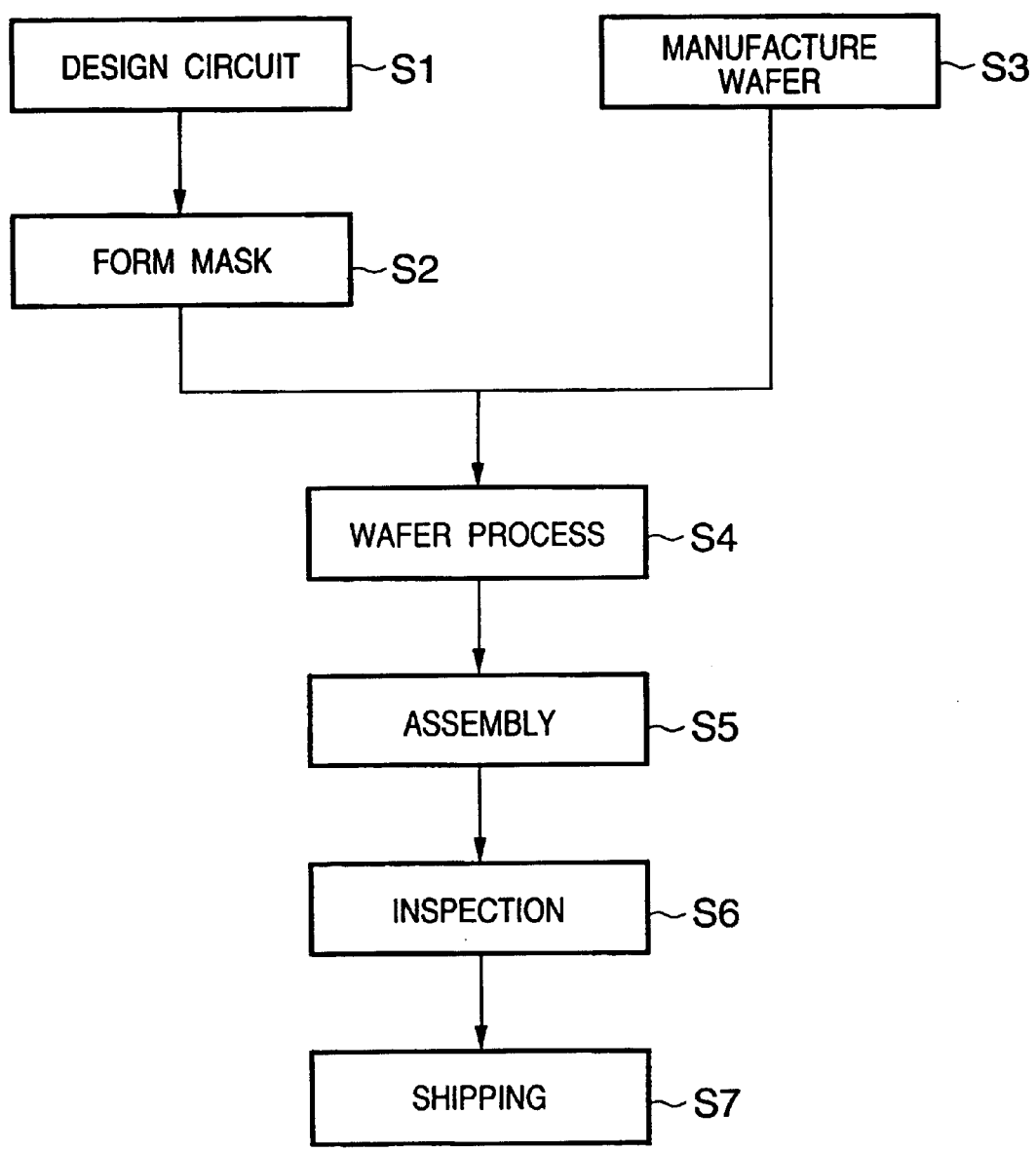
FIG. 12 is a flow chart showing the flow of a semiconductor device manufacturing process.

A semiconductor device manufacturing process using the above-described production system will be explained. FIG. 12 shows the flow of the whole manufacturing process of the semiconductor device. In step 1 (circuit design), a semiconductor device circuit is designed. In step 2 (creation of exposure control data), exposure control data of the exposure apparatus is created based on the designed circuit pattern. In step 3 (wafer manufacture), a wafer is manufactured using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as an operation confirmation test and a durability test of the semiconductor device manufactured in step 5 are conducted. After these steps, the semiconductor device is completed and shipped (step 7). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated-line network.

Figure 13:
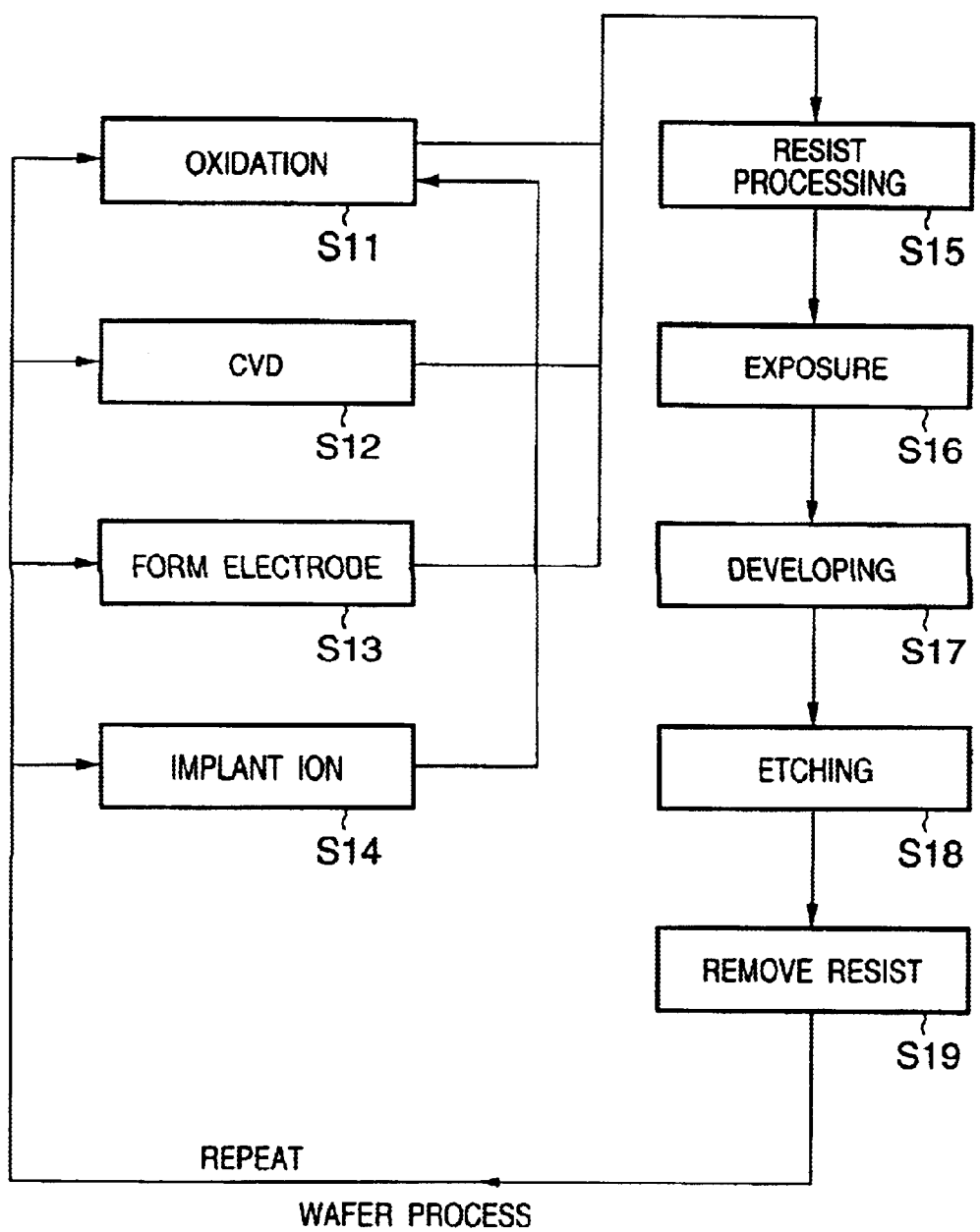
FIG. 13 is a flow chart showing the flow of a wafer process.

FIG. 13 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus bakes and exposes the circuit pattern of a mask on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

In one aspect, the exposure apparatus of the present invention can suppress deformation of a chamber upon reducing the internal pressure of the chamber having an optical element.

In another aspect, the exposure apparatus of the present invention can keep the purity of inert gas in the chamber high.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus comprising:
    a chamber which incorporates an optical element and surrounds a predetermined region;
    a mechanism for setting an inert gas atmosphere in said chamber; and
    a closed vessel which surrounds said chamber,
    wherein a purity of inert gas in said chamber is higher than a purity of inert gas in said closed vessel.

2. The apparatus according to claim 1, wherein the purity of the inert gas in said closed vessel is higher than a purity of inert gas outside said closed vessel.

3. The apparatus according to claim 1, wherein said mechanism discharges gas from said chamber before setting the inert gas atmosphere in said chamber.

4. The apparatus according to claim 1, wherein said closed vessel has a transmission window for transmitting light.

5. The apparatus according to claim 4, wherein the transmission window is formed from fluoride glass.

6. The apparatus according to claim 1, wherein said closed vessel has an opening/closing door.

7. The apparatus according to claim 1, further comprising a vent hole for allowing said chamber and said closed vessel to communicate with each other.

8. The apparatus according to claim 4, wherein a vent hole is freely opened/closed.

9. The apparatus according to claim 1, wherein said chamber incorporates at least some of optical elements of an illumination optical unit.

10. The apparatus according to claim 1, wherein said chamber incorporates at least some of optical elements of a projection optical unit.

11. The apparatus according to claim 1, wherein the inert gas contains at least one of helium and nitrogen.

12. The apparatus according to claim 1, wherein said chamber surrounds at least part of an optical path of light in a vacuum ultraviolet region.

13. An exposure apparatus comprising:
a chamber which incorporates an optical element and surrounds a predetermined region;
a mechanism for setting an inert gas atmosphere in said chamber; and
a closed vessel which surrounds said chamber,
wherein an internal pressure of said chamber is higher than an internal pressure of said closed vessel.

14. The apparatus according to claim 13, wherein a pressure of inert gas in said closed vessel is higher than a pressure of inert gas outside said closed vessel.

15. The apparatus according to claim 13, wherein said mechanism discharges gas from said chamber before setting the inert gas atmosphere in said chamber.

16. The apparatus according to claim 13, wherein said closed vessel has a transmission window for transmitting light.

17. The apparatus according to claim 16, wherein the transmission window is formed from fluoride glass.

18. The apparatus according to claim 13, wherein said closed vessel has an opening/closing door.

19. The apparatus according to claim 13, further comprising a vent hole for allowing said chamber and said closed vessel to communicate with each other.

20. The apparatus according to claim 19, wherein the vent hole is freely opened/closed.

21. The apparatus according to claim 13, wherein said chamber incorporates at least some of optical elements of an illumination optical unit.

22. The apparatus according to claim 13, wherein said chamber incorporates at least some of optical elements of a projection optical unit.

23. The apparatus according to claim 13, wherein the inert gas includes at least one of helium and nitrogen.

24. The apparatus according to claim 13, wherein said chamber surrounds at least part of an optical path of light in a vacuum ultraviolet region.

25. A gas replacement method comprising the steps of:
supplying inert gas into a chamber which incorporates an optical element;
supplying inert gas into a closed vessel which surrounds the chamber; and
controlling a purity of the inert gas in the chamber to be higher than a purity of the inert gas in the closed vessel.

26. The method according to claim 25, further comprising the step of controlling the purity of the inert gas in the closed vessel to be higher than a purity of inert gas outside the closed vessel.

27. A gas replacement method comprising the steps of:
supplying inert gas into a chamber which incorporates an optical element;
supplying inert gas into a closed vessel which surrounds the chamber; and
controlling a pressure of the inert gas in the chamber to be higher than a pressure of the inert gas in the closed vessel.

28. The method according to claim 27, further comprising the step of controlling the pressure of the inert gas in the closed vessel to be higher than a pressure of inert gas outside the closed vessel.

29. An exposure apparatus comprising:
a chamber which incorporates an optical element;
a closed vessel which surrounds said chamber; and
a pump for reducing an internal pressure of said chamber,
wherein a pressure of said closed vessel is reduced when the internal pressure of the camber is reduced,
wherein said chamber is supported by a member which supports a lens barrel that holds the optical element, and
wherein said closed vessel is coupled to the surface plate via a movable displacement adjusting member.

30. The apparatus according to claim 29, wherein said movable displacement adjusting member includes a bellows.

31. A device manufacturing method comprising the steps of:
exposing a member to be processed by the exposure apparatus defined in claim 29; and
developing the exposed member in order to manufacture the device.

32. A gas replacement method comprising the steps of:
reducing an internal pressure of a chamber which incorporates an optical element;
reducing a pressure of a closed vessel which surrounds the chamber; and
supplying inert gas into the chamber,
whererin a displacement is generated between the chamber and the closed vessel.

33. The method according to claim 32, further comprising measuring a positional relationship between a reference member and the chamber, and controlling a displacement mechanism based on a measurement result.

34. A device manufacturing method comprising the steps of:
exposing a member to be processed by using an exposure apparatus and the gas replacement method defined in claim 32; and
developing the exposed member in order to manufacture the device.

35. An exposure apparatus comprising:
a chamber which incorporates an optical element;
a closed vessel which surrounds said chamber; and
a pump for reducing an internal pressure of said chamber,
wherein said chamber is supported by a supporting member and said closed vessel is coupled to the supporting member via a movable displacement adjusting member for absorbing a displacement, wherein the movable displacement adjusting member includes a bellows.

36. A device manufacturing method comprising the steps of:
exposing a member to be processed by the exposure apparatus defined in claim 35; and
developing the exposed member in order to manufacture the device.

37. An exposure apparatus comprising:
a chamber which incorporates an optical element;
a closed vessel which surrounds said chamber; and
a pump for reducing an internal pressure of said chamber,
wherein said chamber is supported by a supporting member, and said closed vessel is coupled to the supporting member via movable displacement adjusting member for absorbing a displacement,
wherein the apparatus further comprises a second movable displacement adjusting member for adjusting deformation of said closed vessel, and
said second movable displacement adjusting member holds a transmission window, said transmission window being held at a predetermined positional relationship with respect to the optical element in the chamber.

38. The apparatus according to claim 37, wherein movable displacement adjusting member includes a bellows.

39. The apparatus according to claim 37, wherein said second movable displacement adjusting member includes a bellows.

40. A device manufacturing method comprising the steps of:
exposing a member to be processed by the exposure apparatus defined in claim 37; and
developing the exposed member in order to manufacture the device.

41. An exposure apparatus comprising:
a chamber which incorporates an optical element;
a closed vessel which surrounds the chamber; and
a member which supports the chamber,
wherein the member is coupled to the vessel via a deformable member, and
wherein the member has a portion which passes through the closed vessel.

42. The apparatus according to claim 41, further comprising a pump for reducing an internal pressure of the closed vessel.

43. The apparatus according to claim 41, wherein the deformable member includes a bellows.

44. The apparatus according to claim 41, further comprising a hole for allowing the chamber and the closed vessel to communicate with each other.

45. The apparatus according to claim 44, wherein the internal pressure of the chamber and the internal pressure of the closed vessel are controlled to have substantially the same internal pressure by the communication via the hole.

46. A device manufactoring method comprising the steps of:
exposing a member to be processed by the exposure apparatus defined in claim 41; and
developing the exposed member in order to manufacture the device.

47. An exposure apparatus comprising:
a chamber which incorporates an optical element;
a closed vessel which surrounds the chamber; and
a member which supports the chamber,
wherein the supporting member is coupled to the closed vessel via a bellows.

48. The apparatus according to claim 47, further comprising a pump for reducing an internal pressure of the closed vessel.

49. The apparatus according to claim 47, wherein the supporting member has a region which passes through the closed vessel and supports the chamber.

50. The apparatus according to claim 47, further comprising a hole for allowing the chamber and the closed vessel to communicate with each other.

51. The apparatus according to claim 50, wherein the internal pressure of the chamber and the internal pressure of the closed vessel are controlled to have substantially the same internal pressure by the communication via the hole.

52. A device manufactoring method comprising the steps of:
exposing a member to be processed by the exposure apparatus defined in claim 47; and
developing the exposed member in order in order to manufacture the device.

* * * * *

UNITED STATES PATENT AND TRADEMARK OFFICE
CERTIFICATE OF CORRECTION

PATENT NO. : 6,714,277 B2 Page 1 of 1
DATED : March 30, 2004
INVENTOR(S) : Shinichi Hara et al.

It is certified that error appears in the above-identified patent and that said Letters Patent is hereby corrected as shown below:

Column 1,
Lines 53 and 55, "On" should read -- At --.

Column 2,
Line 13, "a vessel which airtightly" should read -- an airtight vessel which --.

Column 18,
Lines 25-30, should be deleted.
Line 62, "influence" should read -- influences --.

Column 20,
Line 37, "vender" should read -- vendor --.
Line 40, "vender," should read -- vendor, --.

Column 24,
Line 25, "camber" should read -- chamber --.
Line 46, "whererin" should read -- wherein --.
Line 67, "displacement," should read -- displacement, and --.

Column 25,
Line 16, "via movable" should read -- via a movable --.
Line 21, "said" should read -- wherein said --.
Line 25, "wherein" should read -- wherein the --.

Column 26,
Lines 12 and 37, "manufactoring" should read -- manufacturing --.
Line 41, the second occurrence of "in order" should be deleted.

Signed and Sealed this

Twenty-third Day of November, 2004

JON W. DUDAS
*Director of the United States Patent and Trademark Office*

UNITED STATES PATENT AND TRADEMARK OFFICE
CERTIFICATE OF CORRECTION

PATENT NO. : 6,714,277 B2
DATED : March 30, 2004
INVENTOR(S) : Shinichi Hara et al.

It is certified that error appears in the above-identified patent and that said Letters Patent is hereby corrected as shown below:

Column 1,
Lines 53 and 55, "On" should read -- At --.

Column 2,
Line 13, "a vessel which airtightly" should read -- an airtight vessel which --.

Column 18,
Lines 25-30, should be deleted.
Line 62, "influence" should read -- influences --.

Column 20,
Line 37, "vender" should read -- vendor --.
Line 40, "vender," should read -- vendor, --.

Column 24,
Line 25, "camber" should read -- chamber --.
Line 46, "wherein" should read -- wherein --.
Line 67, "displacement," should read -- displacement, and --.

Column 25,
Line 16, "via movable" should read -- via a movable --.
Line 21, "said" should read -- wherein said --.
Line 25, "wherein" should read -- wherein the --.

Column 26,
Lines 12 and 37, "manufactoring" should read -- manufacturing --.
Line 41, the second occurrence of "in order" should be deleted.

Signed and Sealed this

Seventh Day of December, 2004

JON W. DUDAS
*Director of the United States Patent and Trademark Office*